(12) United States Patent
Byun et al.

(10) Patent No.: US 11,468,841 B2
(45) Date of Patent: Oct. 11, 2022

(54) EMISSION CONTROL DRIVER AND DISPLAY APPARATUS INCLUDING THE SAME

(71) Applicant: Samsung Display Co., Ltd., Yongin-si (KR)

(72) Inventors: Minwoo Byun, Yongin-si (KR); Jongwon Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/146,303

(22) Filed: Jan. 11, 2021

(65) Prior Publication Data

US 2021/0335263 A1 Oct. 28, 2021

(30) Foreign Application Priority Data

Apr. 27, 2020 (KR) .......................... 10-2020-0051052

(51) Int. Cl.
*G09G 3/3258* (2016.01)
*G09G 5/10* (2006.01)

(52) U.S. Cl.
CPC ............ *G09G 3/3258* (2013.01); *G09G 5/10* (2013.01); *G09G 2300/0876* (2013.01); *G09G 2310/08* (2013.01)

(58) Field of Classification Search
CPC .. G09G 3/3233; G09G 3/3258; G09G 3/3266; G09G 5/10; G09G 2230/00; G09G 2300/0876; G09G 2310/0286; G09G 2310/08; G11C 19/28

See application file for complete search history.

(56) References Cited

U.S. PATENT DOCUMENTS

| 9,634,038 | B2 | 4/2017 | Kwon et al. |
| 10,453,386 | B2 | 10/2019 | Jang |
| 2017/0365211 | A1* | 12/2017 | Lee ...................... G09G 3/3266 |
| 2019/0318690 | A1 | 10/2019 | Lee et al. |
| 2020/0152127 | A1 | 5/2020 | Kang et al. |

FOREIGN PATENT DOCUMENTS

| KR | 10-2017-0133578 A | 12/2017 |
| KR | 10-1962860 B1 | 3/2019 |
| KR | 10-2019-0120846 A | 10/2019 |
| KR | 10-2020-0055206 A | 5/2020 |

* cited by examiner

*Primary Examiner* — Chanh D Nguyen
*Assistant Examiner* — Benjamin Morales
(74) *Attorney, Agent, or Firm* — Lewis Roca Rothgerber Christie LLP

(57) ABSTRACT

An emission control driver includes: a plurality of stages having: a first circuit portion configured to generate a first control signal at a first node and a second control signal at a second node; a second circuit portion configured to control a voltage level of the first control signal; a third circuit portion configured to generate a third control signal based on the first control signal, the second control signal, and the second clock signal; a first output transistor configured to output a first voltage as the emission control signal in response to the first control signal; and a second output transistor configured to output a second voltage as the emission control signal, and wherein the third circuit portion comprises a first capacitor configured to maintain a substantially constant voltage between both electrodes while each of the plurality of stages outputs the emission control signal.

18 Claims, 11 Drawing Sheets

EMISSION CONTROL DRIVER AND DISPLAY APPARATUS INCLUDING THE SAME

CROSS-REFERENCE TO RELATED APPLICATION

The present application claims priority to and the benefit of Korean Patent Application No. 10-2020-0051052, filed on Apr. 27, 2020, in the Korean Intellectual Property Office, the entire disclosure of which is incorporated herein by reference.

BACKGROUND

1. Field

Aspects of one or more example embodiments relate to an emission control driver and a display apparatus including the emission control driver.

2. Description of Related Art

Organic light-emitting display apparatuses display images using organic light-emitting diodes that generate light by recombination of electrons and holes. Organic light-emitting display apparatuses have relatively fast response times and may be driven with relatively low power consumption. An organic light-emitting display apparatus may include pixel driving circuits arranged in a matrix and display elements (e.g., organic light-emitting diodes) connected to the pixel driving circuits.

The pixel driving circuit may be connected to a scan line for transmitting a scan signal, a data line for transmitting a data signal, a control line for transmitting an emission control signal, and a power line for transmitting a pixel driving voltage. The data signal may be applied to the pixel driving circuit in synchronization with the scan signal, and the brightness of the display device may be adjusted according to the amplitude of the data signal applied to the pixel driving circuit. The emission timing of the display device may be determined according to the emission control signal applied to the pixel driving circuit. The organic light-emitting display apparatus may include a scan driver for supplying a scan signal, a data driver for supplying a data signal, an emission control driver for supplying an emission control signal, and a timing controller for controlling the scan driver, the data driver, and the emission control driver. The emission control driver may control the luminance of the display panel by controlling the width of the emission control signal.

Portable electronic devices such as smartphones, tablet PCs, digital cameras, laptop computers, and navigation devices may include organic light-emitting display apparatuses for displaying images. Because portable electronic devices are generally powered by one or more batteries, it may be desirable to reduce or minimize the power consumption of the organic light-emitting display apparatus as much as possible.

The above information disclosed in this Background section is only for enhancement of understanding of the background and therefore the information discussed in this Background section does not necessarily constitute prior art.

SUMMARY

Aspects of some example embodiments include an emission control driver which may generate an emission control signal while reducing or minimizing power consumption (e.g., reducing unnecessary power consumption).

Aspects of some example embodiments include a display apparatus including an emission control driver which may generate an emission control signal while reducing or minimizing power consumption (e.g., reducing unnecessary power consumption).

The technical characteristics of embodiments according to the present disclosure are not limited to the above-described characteristics, and other technical characteristics that are not mentioned herein would be clearly understood by a person skilled in the art from the description of the disclosure.

According to one or more example embodiments, an emission control driver includes a plurality of stages connected to each other in cascade and sequentially outputting emission control signals. Each of the stages includes a first circuit portion configured to generate a first control signal at a first node and a second control signal at a second node based on an input signal and a first clock signal, a second circuit portion configured to control a voltage level of the first control signal based on the first control signal and a second clock signal, a third circuit portion configured to generate a third control signal based on the first control signal, the second control signal, and the second clock signal, a first output transistor configured to output a first voltage as the emission control signal in response to the first control signal, and a second output transistor configured to output a second voltage as the emission control signal in response to the third control signal. The third circuit portion includes a first capacitor configured to maintain a substantially constant voltage between both electrodes while each of the plurality of stages outputs the emission control signal.

According to one or more example embodiments, a display apparatus includes a display panel including a plurality of pixels, a scan driver configured to supply a scan signal to the plurality of pixels, a data driver configured to supply a data signal to the plurality of pixels, an emission control driver configured to supply an emission control signal to the plurality of pixels, and a timing controller configured to generate control signals to control the scan driver, the data driver, and the emission control driver. The emission control driver includes a plurality of stages connected to each other in cascade and sequentially outputting emission control signals, According to some example embodiments, each of the plurality of stages includes a first circuit portion configured to generate a first control signal at a first node and a second control signal at a second node based on an input signal and a first clock signal, a second circuit portion configured to control a voltage level of the first control signal based on the first control signal and a second clock signal, a third circuit portion configured to generate a third control signal based on the first control signal, the second control signal, and the second clock signal, a first output transistor configured to output a first voltage as the emission control signal in response to the first control signal, and a second output transistor configured to output a second voltage as the emission control signal in response to the third control signal, The third circuit portion includes a first capacitor configured to maintain a substantially constant voltage between both electrodes while each of the plurality of stages outputs the emission control signal.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
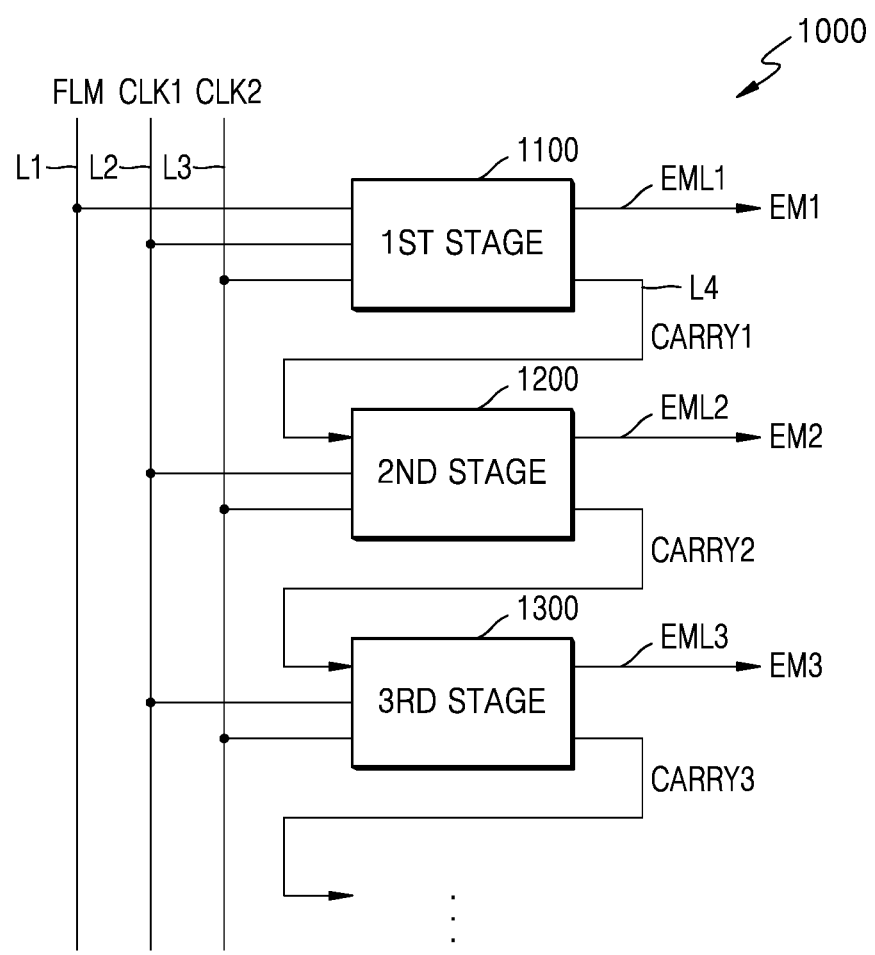
FIG. 1 is a block diagram of an emission control driver according to some example embodiments.

Reference will now be made in more detail to aspects of some example embodiments, which are illustrated in the accompanying drawings, wherein like reference numerals refer to like elements throughout. In this regard, the present embodiments may have different forms and should not be construed as being limited to the descriptions set forth herein. Accordingly, the example embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the present example embodiments, and particular embodiments will be illustrated in the drawings and described in the detailed description section. The effect and features of the present embodiments, and a method to achieve the same, will be clearer referring to the detailed descriptions below with the drawings. However, embodiments according to the present disclosure may be implemented in various forms, not by being limited to the example embodiments presented below.

Hereinafter, example embodiments according to the present disclosure will be described in more detail by explaining example embodiments of the disclosure with reference to the attached drawings. To more clearly describe embodiments according to the present disclosure, descriptions of certain aspects that are not necessary to enable a person having ordinary skill in the art to understand the invention may be omitted, and in the description with reference to the drawings, the same or corresponding constituents are indicated by the same reference numerals and redundant descriptions thereof may be omitted.

In the embodiments below, it will be understood that although the terms "first," "second," etc. may be used herein to describe various components, these components should not be limited by these terms. In the embodiments below, the singular forms "a," "an" and "the" are intended to include the plural forms as well, unless the context clearly indicates otherwise. In the specification, when a constituent element "connects" or is "connected" to another constituent element, the constituent element contacts or is connected to the other constituent element not only directly, but also electrically through at least one of other constituent elements interposed therebetween. Also, when a part may "include" a certain constituent element, unless specified otherwise, it may not be construed to exclude another constituent element but may be construed to further include other constituent elements.

FIG. 1 is a block diagram of an emission control driver 1000 according to some example embodiments.

Referring to FIG. 1, the emission control driver 1000 may include first to n-th stages, for example, first to third stages 1100, 1200, and 1300, connected to one another in a cascade structure. Here, n is a natural number and may correspond to the number of pixel rows of a display panel. Although FIG. 1 illustrates only the first to third stages 1100, 1200, and 1300, the emission control driver 1000 may include the first to n-th stages, and, for example, fourth to the n-th stages are connected to one another in a manner of connecting the first to third stages 1100, 1200, and 1300 to one another.

The first to third stages 1100, 1200, and 1300 are connected to one another in a cascade structure and may sequentially output first to n-th emission control signals, for example, the first to third emission control signals EM1, EM2, and EM3. The first to third emission control signals EM1, EM2, and EM3 may be supplied to pixels of a display panel, for example, pixel driving circuits, via the first to third emission control lines EML1, EML2, and EML3.

One of the first to third stages 1100, 1200, and 1300, for example, the first stage 1100, may receive a start signal FLM via a start signal line L1. Each of the first to third stages 1100, 1200, and 1300 may receive a first clock signal CLK1 via a first clock signal line L2 and a second clock signal CLK2 via a second clock signal line L3. Some of the first to third stages 1100, 1200, and 1300, for example, the second to third stages 1200 and 1300 may receive a carry signal CARRY from the previous stage via carry signal lines L4. For example, a k-th stage may receive the carry signal CARRY from a (k−1)th stage.

The start signal FLM and the carry signal CARRY that are received by the first to third stages 1100, 1200, and 1300 may be referred to as input signals. For example, the input signal input to the first stage 1100 may be the start signal FLM, the input signal input to the second to n-th stages, for example, the second and third stages 1200 and 1300 may be the carry signal CARRY output from the previous stages, that is, the first to (n−1)th stages, for example, the first to third stages 1100, 1200, and 1300.

According to some example embodiments, each of the first to third stages 1100, 1200, and 1300 may receive a first voltage VGL via a first voltage line, and a second voltage VGH via a second voltage line. In this state, the first voltage VGL may be a voltage having a low level, and the second voltage VGH may be a voltage having a high level.

Figure 8:
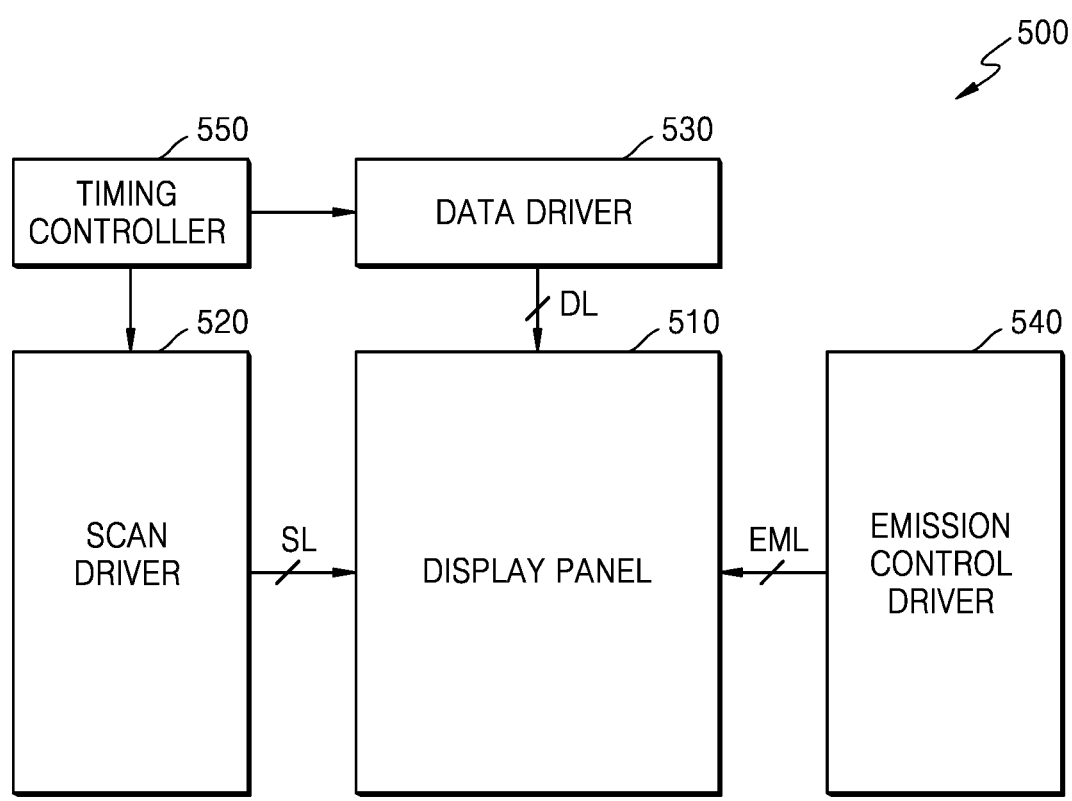
FIG. 8 is a block diagram of a display apparatus according to some example embodiments.

The first stage 1100 may generate a first emission control signal EM1 based on the start signal FLM and the first and second clock signals CLK1 and CLK2, which are received from a timing controller (550 in FIG. 8). The first emission control signal EM1 may be supplied to pixels connected to a first emission control line EML1, via the first emission control line EML1. The first stage 1100 may generate a first carry signal CARRY1 and supply the first carry signal CARRY1 to the second stage 1200 via a carry signal line L4.

The first carry signal CARRY1 and the first emission control signal EM1 may be substantially the same signal, that is, signals having the same level at the same timing.

The second stage 1200 may generate a second emission control signal EM2 based on the first carry signal CARRY1 received from the first stage 1100, and the first and second clock signals CLK1 and CLK2 received from the timing controller. The second emission control signal EM2 may be supplied to pixels connected to a second emission control line EML2, via the second emission control line EML2. The second stage 1200 may generate a second carry signal CARRY2 and supply the second carry signal CARRY2 to the third stage 1300.

The third stage 1300 may generate a third emission control signal EM3 based on the second carry signal CARRY2 received from the second stage 1200, and the first and second clock signals CLK1 and CLK2 received from the timing controller. The third emission control signal EM3 may be supplied to pixels connected to a third emission control line EML3 via the third emission control line EML3. The third stage 1300 may generate a third carry signal CARRY3 to the next stage, that is, the fourth stage.

The first to third stages 1100, 1200, and 1300 of the emission control driver 1000 are connected to one another in cascade in such a manner so that the first to third emission control signals EM1, EM2, and EM3 may be sequentially output. The first stage 1100 may generate the first emission control signal EM1 based on the start signal FLM, the first clock signal CLK1, and the second clock signal CLK2, and the k-th stage may generate a k-th emission control signal EMk based on a (k−1)th carry signal CARRY(k−1), the first clock signal CLK1, and the second clock signal CLK2. In this case, k is a natural number greater than or equal to 2 and less than or equal to n.

Figure 2:
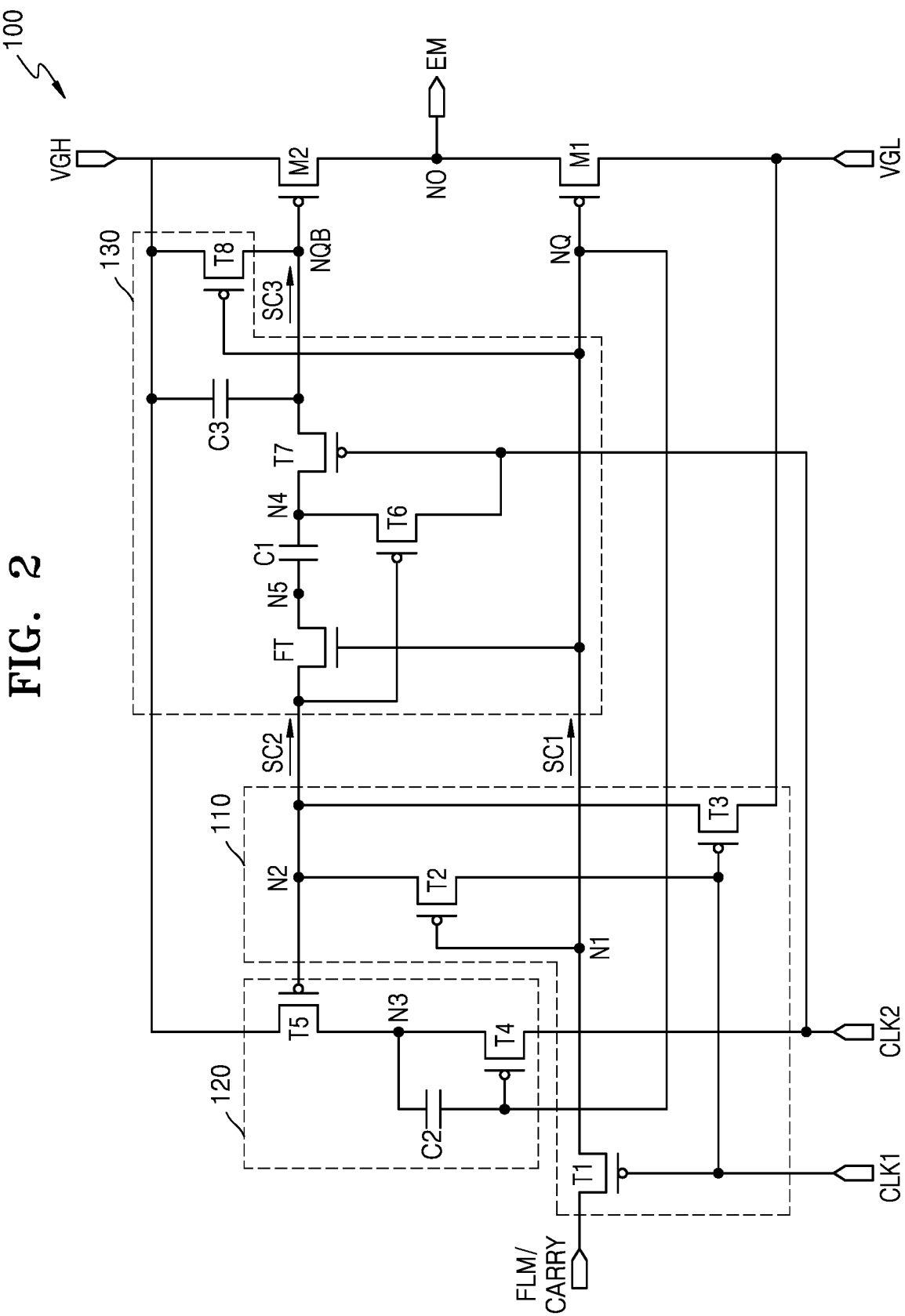
FIG. 2 is a circuit diagram of a stage included in an emission control driver, according to some example embodiments.

FIG. 2 is a circuit diagram of a stage 100 included in the emission control driver 1000, according to some example embodiments.

Referring to FIG. 2, the stage 100 may include a first circuit portion 110, a second circuit portion 120, a third circuit portion 130, a first output transistor M1, and a second output transistor M2. The stage 100 may correspond to one of the first to third stages 1100, 1200, and 1300 of FIG. 1.

An input signal FLM/CARRY is input to the stage 100. The first and second clock signals CLK1 and CLK2 are input to the stage 100, and the first voltage VGL of a low level and the second voltage VGH of a high level are applied to the stage 100. The stage 100 outputs an emission control signal EM based on the input signal FLM/CARRY and the first and second clock signals CLK1 and CLK2.

The input signal FLM/CARRY has a low-level voltage corresponding to the first voltage VGL or the high-level voltage corresponding to the second voltage VGH, according to time. The first and second clock signals CLK1 and CLK2 each also have a low-level voltage corresponding to the first voltage VGL or the high-level voltage corresponding to the second voltage VGH, according to time. The first clock signal CLK1 and the second clock signal CLK2 may have the same cycle and may alternately have a low-level voltage. According to some example embodiments, the first clock signal CLK1 and the second clock signal CLK2 may have the same duty ratio, which may be 50% or greater. The first clock signal CLK1 and the second clock signal CLK2 may not have a low-level voltage at the same time.

The first circuit portion 110 may generate a first control signal SC1 in a first node N1 and a second control signal SC2 in a second node N2, based on the input signal FLM/CARRY and the first clock signal CLK1. The first control signal SC1 and the second control signal SC2 may have a low-level or high-level voltage to control the operation of a switching transistor. The first control signal SC1 may correspond to a voltage of the first node N1, and the second control signal SC2 may correspond to a voltage of the second node N2.

When the stage 100 is the first stage 1100 of FIG. 1, the start signal FLM is input to the first circuit portion 110 as an input signal, and when the stage 100 is one of the second and third stages 1200 and 1300 of FIG. 1, the carry signal CARRY output from the previous stage may be input to the first circuit portion 110 as an input signal.

The second circuit portion 120 may control a voltage level of the first control signal SC1 based on the first control signal SC1 and the second clock signal CLK2. The third circuit portion 130 may generate a third control signal SC3 in a second output node NQB based on the first and second control signals SC1 and SC2, and the second clock signal CLK2. According to some example embodiments, the third circuit portion 130 may include a first capacitor C1 that maintains a substantially constant voltage, between both electrodes of the first capacitor C1, while the stage 100 outputs the emission control signal EM.

The first output transistor M1, in response to the first control signal SC1, may output the first voltage VGL of a low level as the emission control signal EM, and the second output transistor M2, in response to the third control signal SC3, may output the second voltage VGH of a high level as the emission control signal EM. The third control signal SC3 may have a low-level or high-level voltage to control the operation of the second output transistor M2. The third control signal SC3 may correspond to the voltage of the second output node NQB.

The first output transistor M1 may be, as illustrated in FIG. 2, a p-type metal-oxide-semiconductor field-effect transistor (MOSFET). The second output transistor M2 may also be a p-type MOSFET. However, embodiments according to the present disclosure are not limited thereto, and at least one of the first or second output transistors M1 or M2 may be an n-type MOSFET.

According to some example embodiments, the third circuit portion 130 of the stage 100 may further include a floating transistor FT connected between the second node N2 and the first capacitor C1. The floating transistor FT, in response to the first control signal SC1, may connect or separate the second node N2 and the first capacitor C1 to or from each other. The floating transistor FT may be an n-type MOSFET as illustrated in FIG. 2.

According to some example embodiments, the stage 100 may further include second and third capacitors C2 and C3 and at least one of first to eighth switching transistors T1-T8. Although the first to eighth switching transistors T1-T8 may be p-type MOSFETs, embodiments according to the present disclosure are not limited thereto. In the following description, as illustrated in FIG. 2, it is assumed that the first and second output transistors M1 and M2 and the first to eighth switching transistors T1-T8 are p-type MOSFETs, and the floating transistor FT is an n-type MOSFET.

The stage 100 has a plurality of nodes, and some of the nodes are referred to as first to fifth nodes N1-N5 and first and second output nodes NQ and NQB, as illustrated in FIG. 2.

The first circuit portion 110 may include the first switching transistor T1, the second switching transistor T2, and the third switching transistor T3.

The first switching transistor T1 is configured to, in response to the first clock signal CLK1, transmit the input signal FLM/CARRY to the first node N1. The first switching transistor T1, which is turned on in response to the first clock signal CLK1 having a low-level voltage, may be configured to transmit the input signal FLM/CARRY to the first node N1. The first switching transistor T1 is turned off in response to the first clock signal CLK1 having a high-level voltage, and thus the input signal FLM/CARRY is not transmitted to the first node N1.

The second switching transistor T2 is configured to, in response to the first control signal SC1, that is, according to the voltage of the first node N1, transmit the first clock signal CLK1 to the second node N2. The second switching transistor T2, which is turned on in response to the voltage of the first node N1 having a low level, may be configured to transmit the first clock signal CLK1 to the second node N2. The second switching transistor T2 is turned off in response to the voltage of the first node N1 having a high level, and thus the first clock signal CLK1 is not transmitted to the second node N2.

The third switching transistor T3, in response to the first clock signal CLK1, may apply the first voltage VGL of a low level to the second node N2. The third switching transistor T3, which is turned on in response to the first clock signal CLK1 having a low level, may apply the first voltage VGL of a low level to the second node N2. The third switching transistor T3 is turned off in response to the first clock signal CLK1 having a high level, and thus the first voltage VGL of a low level is not applied to the second node N2.

The voltage of the first node N1, as the first control signal SC1, may be input to the second circuit portion 120 and the third circuit portion 130, and the voltage of the second node N2, as the second control signal SC2, may be input to the third circuit portion 130.

The second circuit portion 120 may include the fourth switching transistor T4, the fifth switching transistor T5, and the second capacitor C2.

The fourth switching transistor T4 is configured to, in response to the first control signal SC1, that is, according to the voltage of the first output node NQ, transmit the second clock signal CLK2 to the third node N3. The fourth switching transistor T4, which is turned on in response to the voltage of the first output node NQ having a low level, may be configured to transmit the second clock signal CLK2 to the third node N3. The fourth switching transistor T4 is turned off in response to the voltage of the first output node NQ having a high level, and thus the second clock signal CLK2 is not transmitted to the third node N3.

The fifth switching transistor T5, in response to the second control signal SC2, that is, according to the voltage of the second node N2, applies the second voltage VGH of a high level to the third node N3. The fifth switching transistor T5, which is turned on in response to the voltage of the second node N2 having a low level, may apply the second voltage VGH of a high level to the third node N3. The fifth switching transistor T5 is turned off in response to the voltage of the second node N2 having a high level, and thus the second voltage VGH of a high level is not applied to the third node N3.

The second capacitor C2 may include a first electrode connected to the third node N3 and a second electrode connected to the first output node NQ. As charge is charged in or discharged from the second capacitor C2, the voltage of the first output node NQ, that is, the voltage level of the first control signal SC1, may be adjusted.

In a partial section, a high-level voltage corresponding to the second voltage VGH may be applied to the first electrode of the second capacitor C2, and a low-level voltage corresponding to the first voltage VGL may be applied to the second electrode of the second capacitor C2. In another partial section, due to the charge corresponding to the difference between the high-level voltage and the low-level voltage stored in the second capacitor C2, a voltage difference between the high-level voltage and the low-level voltage may be maintained between the first and second electrodes of the second capacitor C2.

In another partial section, the high-level voltage corresponding to the second voltage VGH is applied to both of the first and second electrodes of the second capacitor C2, and thus substantially zero charge may be stored in the second capacitor C2. In another partial section, due to the substantially zero charge stored in the second capacitor C2, a substantially zero voltage difference may be maintained between the first and second electrodes of the second capacitor C2.

The third circuit portion 130 may include the sixth switching transistor T6, the first capacitor C1, the floating transistor FT, the seventh switching transistor T7, the third capacitor C3, and the eighth switching transistor T8.

The sixth switching transistor T6 is configured to, in response to the second control signal SC2, transmit the second clock signal CLK2 to the fourth node N4. The sixth switching transistor T6, which is turned on in response to the second control signal SC2 having a low-level voltage, may be configured to transmit the second clock signal CLK2 to the fourth node N4. The sixth switching transistor T6 is turned off in response to the second control signal SC2 having a high-level voltage, and thus the second clock signal CLK2 is not transmitted to the fourth node N4.

The first capacitor C1 may include a first electrode connected to the fourth node N4 and a second electrode connected to the fifth node N5. The third circuit portion 130 may adjust the voltage of the second output node NQB, that is, a voltage level of the third control signal SC3, by using at least charge stored in the first capacitor C1. A substantially constant voltage may be maintained between the first and second electrodes of the first capacitor C1. The substantially constant voltage may correspond to a difference between the high-level voltage corresponding to the second voltage VGH and the low-level voltage corresponding to the first voltage VGL.

When the input signal FLM/CARRY of a high level, the first clock signal CLK1 of a low level, and the second clock signal CLK2 of a high level are input to the stage 100, a high-level voltage is applied to the first electrode of the first capacitor C1 and a low-level voltage is applied to the second electrode thereof. Then, the first capacitor C1 may continuously store charge corresponding to the difference between the high-level voltage and the low-level voltage.

When the input signal FLM/CARRY of a low level, the first clock signal CLK1 of a high level, and the second clock signal CLK2 of a high level are input to the stage 100, both of the first and second electrodes of the first capacitor C1 may be in a floating state, and the first capacitor C1 may continuously store charge corresponding to the difference between the high-level voltage and the low-level voltage.

The floating transistor FT may connect or separate the second node N2 and the fifth node N5 to or from each other, in response to the first control signal SC1, that is, according to the voltage of the first node N1. The floating transistor FT, which may be implemented by an n-type MOSFET, is turned on in response to the voltage of the first node N1 having a high level, and may connect the second node N2 and the fifth node N5 to each other. The floating transistor FT, which is turned off in response to the voltage of the first node N1 having a low level, may separate the second node N2 and the fifth node N5 from each other. In this state, when the sixth switching transistor T6 and the seventh switching transistor T7 are turned off, both of the fourth node N4 and the fifth node N5 are substantially in a floating state.

The seventh switching transistor T7, in response to the second clock signal CLK2, may connect or separate the fourth node N4 and the second output node NQB to or from each other. The seventh switching transistor T7, which is turned on in response to the second clock signal CLK2 having a low-level voltage, may connect the fourth node N4 and the second output node NQB to each other. The seventh switching transistor T7, which is turned off in response to the second clock signal CLK2 having a high-level voltage, may separate the fourth node N4 and the second output node NQB from each other.

The third capacitor C3 may include a first electrode to which the second voltage VGH of a high level is applied and a second electrode connected to the second output node NQB. The third circuit portion 130 may adjust the voltage of the second output node NQB, that is, the voltage level of the third control signal SC3 by using at least charge stored in the third capacitor C3.

The second voltage VGH of a high level is applied to the first electrode of the third capacitor C3. In a partial section, a low-level voltage corresponding to the first voltage VGL may be applied to the second electrode of the third capacitor C3. In another partial section, due to the charge corresponding to the difference between the high-level voltage and the low-level voltage stored in the third capacitor C3, a voltage difference between the high-level voltage and the low-level voltage may be maintained between the first and second electrodes of the third capacitor C3. In another partial section, the high-level voltage corresponding to the second voltage VGH is applied to the second electrode of the third capacitor C3, and thus a substantially zero charge may be stored in the third capacitor C3. In another partial section, due to the substantially zero charge stored in the third capacitor C3, a substantially zero voltage difference may be maintained between the first and second electrodes of the third capacitor C3.

The eighth switching transistor T8, in response to the first control signal SC1, that is, according to the voltage of the first node N1, applies the second voltage VGH of a high level to the second output node NQB, that is, a gate of the second output transistor M2. The eighth switching transistor T8, which is turned on in response to the voltage of the first node N1 having a low level, may apply the second voltage VGH of a high level to the second output node NQB and connect the first and second electrodes of the third capacitor C3 to each other. The eighth switching transistor T8 is turned off in response to the voltage of the first node N1 having a high level, and thus the second voltage VGH of a high level is not applied to the second output node NQB.

The first output transistor M1 may output the first voltage VGL of a low level as the emission control signal EM at a stage output node NO according to the voltage of the first output node NQ, for example, in response to the first control signal SC1. The second output transistor M2, in response to the voltage of the second output node NQB, that is, the third control signal SC3, may output the second voltage VGH of a high level as the emission control signal EM at the stage output node NO.

The stage output node NO outputs the first voltage VGL as the emission control signal EM of a low level when the first output transistor M1 is turned on, and outputs the second voltage VGH as the emission control signal EM of a high level when the second output transistor M2 is turned on. The first output transistor M1 and the second output transistor M2 are not turned on at the same time.

The operation of the stage 100 is described below with reference to FIG. 3.

Figure 3:
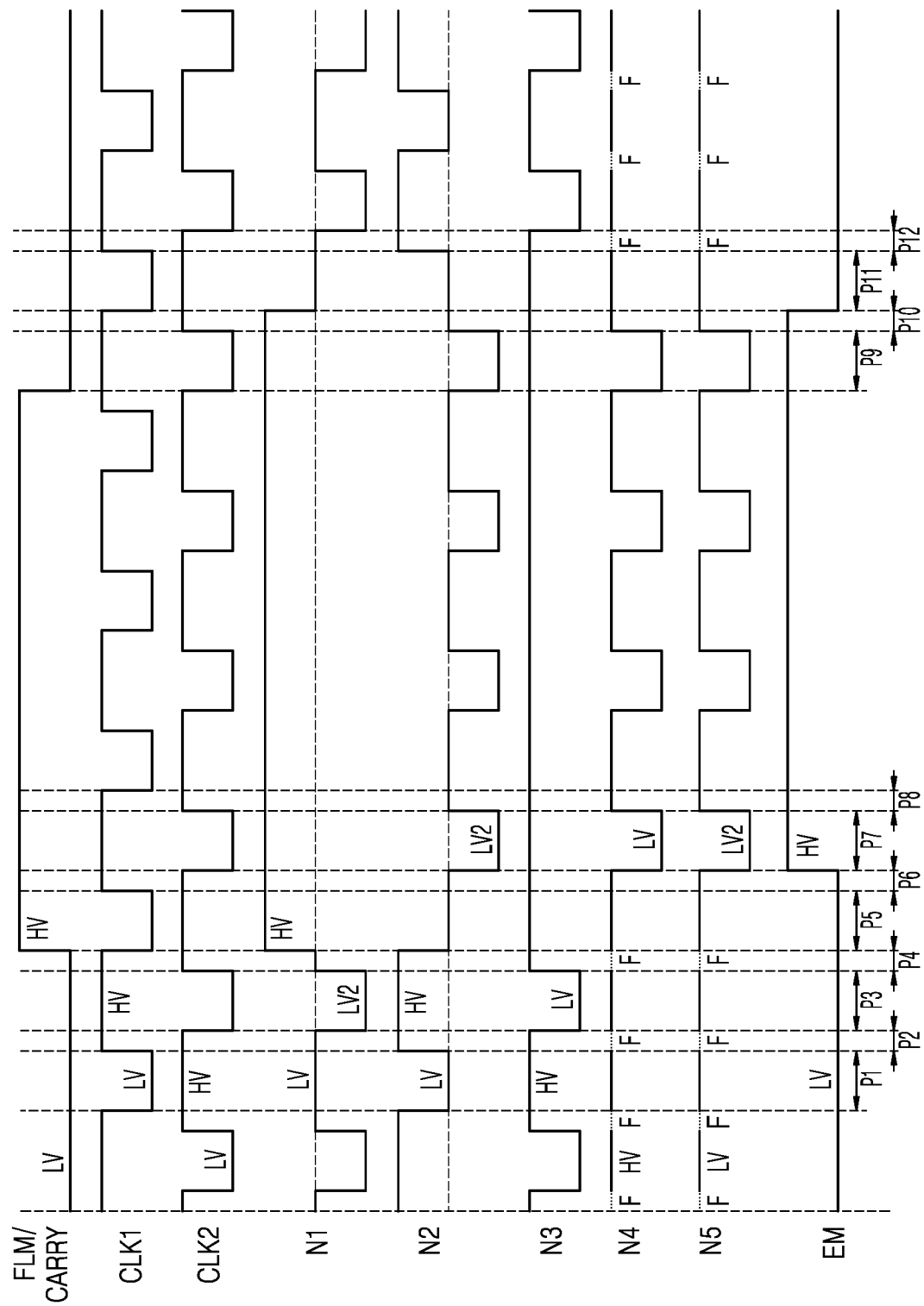
FIG. 3 is a timing diagram of an operation of the stage of FIG. 2.

FIG. 3 is a timing diagram of an operation of the stage of FIG. 2.

Referring to FIG. 3, the input signal FLM/CARRY may have, within one frame period, a low-level voltage LV corresponding to a time during which a display device of a pixel emit light, and a high-level voltage HV corresponding to a time during which the display device of a pixel does not emit light. A data signal corresponding to a gradation to be displayed for a next frame period may be input to a pixel driving circuit for the time during which the display device does not emit light.

The low-level voltage LV corresponds to the first voltage VGL, and the high-level voltage HV corresponds to the second voltage VGH. In this case, the low-level voltage LV and the high-level voltage HV respectively corresponding to the first voltage VGL and the second voltage VGH may mean that the low-level voltage LV is a voltage that is substantially the same as the first voltage VGL or has a level slightly higher than the first voltage VGL, and the high-level voltage HV is a voltage that is substantially the same as the second voltage VGH or has a level slightly lower than the second voltage VGH. A difference between the low-level voltage LV and the first voltage VGL, and a difference between the high-level voltage HV and the second voltage VGH, may be generated by threshold voltages of switching transistors.

For a partial period, charge corresponding to the voltage difference between the high-level voltage HV and the low-level voltage LV is stored in the first to third capacitors C1, C2, and C3, and the voltage difference between the high-level voltage HV and the low-level voltage LV may be maintained between both electrodes of each of the first to third capacitors C1, C2, and C3. In the present specification, the voltage difference between the high-level voltage HV and the low-level voltage LV is referred to as a reference voltage difference. A voltage lower than the low-level voltage LV by the reference voltage difference is referred to as a second low-level voltage LV2, and a voltage higher than the high-level voltage HV by the reference voltage difference is referred to as a second high-level voltage HV2.

The first clock signal CLK1 and the second clock signal CLK2 are all cyclic signals having the same cycle. The first clock signal CLK1 and the second clock signal CLK2 may alternately have the low-level voltage LV. The first clock signal CLK1 and the second clock signal CLK2 may have the same duty ratio. For example, the duty ratio of the first clock signal CLK1 is (P2+P3+P4)/(P1+P2+P3+P4), and the duty ratio of the second clock signal CLK2 is (P1+P2+P4)/(P1+P2+P3+P4).

According to some example embodiments, as illustrated in FIG. 3, the first clock signal CLK1 may have the low-level voltage LV in a first period P1 and a fifth period P5, and the second clock signal CLK2 may have the low-level voltage LV in a third period P3 and a seventh period P7. The first clock signal CLK1 may have the high-level voltage HV in second to fourth periods P2-P4 and sixth to eighth periods P6-P8, and the second clock signal CLK2 may have the high-level voltage HV in the first, second, fourth to sixth, and eighth periods P1, P2, P4-P6, and P8.

Furthermore, the first clock signal CLK1 may have the low-level voltage LV in an eleventh period P11 and the high-level voltage HV in ninth, tenth, and twelfth periods P9, P10, and P12. The second clock signal CLK2 may have the low-level voltage LV in the ninth period P9 and the high-level voltage HV in the tenth to twelfth periods P10-P12.

The input signal FLM/CARRY may have the low-level voltage LV in the first to fourth periods P1-P4 and the high-level voltage HV in the fifth to eighth periods P5-P8. The input signal FLM/CARRY may have the high-level voltage HV until the ninth period P9 and the low-level voltage LV from the ninth period P9.

The emission control signal EM is shifted to the high-level voltage HV, in response to the second clock signal CLK2 having the low-level voltage LV, while the input signal FLM/CARRY has the high-level voltage HV, and shifted to the low-level voltage LV, in response to the first clock signal CLK1 having the low-level voltage LV, while the input signal FLM/CARRY has the low-level voltage LV.

In the first period P1, the input signal FLM/CARRY having the low-level voltage LV, the first clock signal CLK1 having the low-level voltage LV, and the second clock signal CLK2 having the high-level voltage HV are input to the stage 100.

In the first period P1, the first circuit portion 110 generates the first control signal SC1 having the low-level voltage LV and the second control signal SC2 having the low-level voltage LV. In the first period P1, the first switching transistor T1 is turned on in response to the first clock signal CLK1 having the low-level voltage LV, and the input signal FLM/CARRY of the low-level voltage LV is transmitted to the first node N1. Accordingly, the voltage of the first node N1, that is, the first control signal SC1, has the low-level voltage LV. The first control signal SC1 having the low-level voltage LV is transmitted to the first output node NQ.

The second switching transistor T2 is turned on in response to the low-level voltage LV of the first node N1, and the first clock signal CLK1 having the low-level voltage LV is transmitted to the second node N2. Furthermore, the third switching transistor T3 is turned on in response to the first clock signal CLK1 having the low-level voltage LV, and the first voltage VGL is applied to the second node N2. Accordingly, the voltage of the second node N2, that is, the second control signal SC2, has the low-level voltage LV.

The fifth switching transistor T5 is turned on in response to the low-level voltage LV of the second node N2, that is, the second control signal SC2, and the second voltage VGH is applied to the third node N3. Furthermore, the fourth switching transistor T4 is turned on in response to the low-level voltage LV of the first output node NQ, and the second clock signal CLK2 of the high-level voltage HV is transmitted to the third node N3.

The high-level voltage HV is applied to the first electrode of the second capacitor C2, which is connected to the third node N3, and the low-level voltage LV is applied to the second electrode that is connected to the first output node NQ, and thus the reference voltage difference is stored in the second capacitor C2.

The sixth switching transistor T6 is turned on in response to the low-level voltage LV of the second node N2, that is, the second control signal SC2, and the second clock signal CLK2 of the high-level voltage HV is transmitted to the fourth node N4. The seventh switching transistor T7 is turned off in response to the second clock signal CLK2 of the high-level voltage HV, and the eighth switching transistor T8 is turned on in response to the low-level voltage LV of the first node N1, and the second voltage VGH is applied to the second output node NQB. The high-level voltage HV is applied to both electrodes of the third capacitor C3.

The first output transistor M1 may be weakly turned on in response to the low-level voltage LV of the first output node NQ, and as the first voltage VGL is applied to the stage output node NO, the emission control signal EM of the low-level voltage LV may be output. The second output transistor M2 is turned off in response to the high-level voltage HV of the second output node NQB.

The floating transistor FT is turned off in response to the low-level voltage LV of the first node N1, and the low-level voltage LV of the second node N2 is not transmitted to the fifth node N5. Accordingly, no current is charged in or discharged from the first capacitor C1, and thus there is no power consumption to charge or discharge the first capacitor C1 in the first period P1.

In the second period P2, the input signal FLM/CARRY having the low-level voltage LV, the first clock signal CLK1 having the high-level voltage HV, and the second clock signal CLK2 having the high-level voltage HV are input to the stage 100. In the second period P2, the first circuit portion 110 generates the first control signal SC1 having the low-level voltage LV and the second control signal SC2 having the high-level voltage HV.

In the second period P2, the first switching transistor T1 is turned off in response to the first clock signal CLK1 having the high-level voltage HV, and the input signal FLM/CARRY of the low-level voltage LV is not transmitted to the first node N1. However, the fourth switching transistor T4 is turned on due to the reference voltage difference stored in the second capacitor C2. The second clock signal CLK2 having the high-level voltage HV is applied to the third node N3 through the fourth switching transistor T4 that is turned on. The first output node NQ and the first node N1 have the low-level voltage LV due to the second capacitor C2 that stores the reference voltage difference. The first control signal SC1 of the first node N1 has the low-level voltage LV.

The third switching transistor T3 is turned off in response to the first clock signal CLK1 of the high-level voltage HV, the second switching transistor T2 is turned on in response to the low-level voltage LV of the first node N1, and the first clock signal CLK1 of the high-level voltage HV is transmitted to the second node N2.

The high-level voltage HV of the second node N2 turns off the fifth switching transistor T5 and the sixth switching transistor T6. Furthermore, the seventh switching transistor T7 is turned off in response to the second clock signal CLK2 of the high-level voltage HV. The eighth switching transistor T8 is turned on in response to the low-level voltage LV of the first node N1, and the second voltage VGH is applied to the second output node NQB. The high-level voltage HV is applied to both electrodes of the third capacitor C3.

The first output transistor M1 may be weakly turned on in response to the low-level voltage LV of the first output node NQ, and as the first voltage VGL is applied to the stage output node NO, the emission control signal EM of the low-level voltage LV may be output. The second output transistor M2 is turned off in response to the high-level voltage HV of the second output node NQB.

The floating transistor FT is turned off in response to the low-level voltage LV of the first node N1, and the high-level voltage HV of the second node N2 is not transmitted to the fifth node N5.

As the floating transistor FT and the sixth and seventh switching transistors T6 and T7 connected to both electrodes of the first capacitor C1 are all turned off, the first capacitor C1 is in a floating state, and current is not charged in or discharged from the first capacitor C1. Accordingly, in the second period P2, there is no power consumption to charge or discharge the first capacitor C1.

In the third period P3, the input signal FLM/CARRY having the low-level voltage LV, the first clock signal CLK1 having the high-level voltage HV, and the second clock signal CLK2 having the low-level voltage LV are input to the stage 100. In the third period P3, the first circuit portion 110 generates the first control signal SC1 having the second low-level voltage LV2 and the second control signal SC2 having the high-level voltage HV.

In the third period P3, the first switching transistor T1 is turned off in response to the first clock signal CLK1 having the high-level voltage HV. However, the fourth switching transistor T4 is turned on due to the reference voltage difference stored in the second capacitor C2. The third node N3 applies the second clock signal CLK2 having the low-level voltage LV through the fourth switching transistor T4 that is turned on. The first output node NQ and the first node N1 have the second low-level voltage LV2 due to the second capacitor C2 that stores the reference voltage difference. The second low-level voltage LV2 is a voltage lower than the low-level voltage LV by the reference voltage difference. The first control signal SC1 of the first node N1 has the second low-level voltage LV2.

The third switching transistor T3 is turned off in response to the first clock signal CLK1 of the high-level voltage HV, the second switching transistor T2 is turned on in response to the second low-level voltage LV2 of the first node N1, and the first clock signal CLK1 of the high-level voltage HV is transmitted to the second node N2.

The high-level voltage HV of the second node N2 turns off the fifth switching transistor T5 and the sixth switching transistor T6. The eighth switching transistor T8 is turned on in response to the low-level voltage LV of the first node N1, and the second voltage VGH is applied to the second output node NQB. The high-level voltage HV is applied to both electrodes of the third capacitor C3. The seventh switching transistor T7 is turned on in response to the second clock signal CLK2 of the low-level voltage LV, and the high-level voltage HV of the second output node NQB is transmitted to the fourth node N4.

The first output transistor M1 is completely turned on in response to the second low-level voltage LV2 of the first output node NQ, and as the first voltage VGL is applied to the stage output node NO, the emission control signal EM of the low-level voltage LV is output. The second output transistor M2 is turned off in response to the high-level voltage HV of the second output node NQB.

The floating transistor FT is turned off in response to the second low-level voltage LV2 of the first node N1, and the high-level voltage HV of the second node N2 is not applied to the fifth node N5. Accordingly, no current is charged in or discharged from the first capacitor C1, and thus there is no power consumption to charge or discharge the first capacitor C1 in the third period P3.

In the fourth period P4, the input signal FLM/CARRY having the low-level voltage LV, the first clock signal CLK1 having the high-level voltage HV, and the second clock signal CLK2 having the high-level voltage HV are input to the stage 100. In the fourth period P4, the first circuit portion 110 generates the first control signal SC1 having the low-level voltage LV and the second control signal SC2 having the high-level voltage HV.

In the fourth period P4, the first switching transistor T1 is turned off in response to the first clock signal CLK1 having the high-level voltage HV. However, the fourth switching transistor T4 is turned on due to the reference voltage difference stored in the second capacitor C2. The second clock signal CLK2 having the high-level voltage HV is applied to the third node N3 through the fourth switching transistor T4 that is turned on. The first output node NQ and the first node N1 have the low-level voltage LV due to the second capacitor C2 that stores the reference voltage difference. The first control signal SC1 of the first node N1 has the low-level voltage LV.

The third switching transistor T3 is turned off in response to the first clock signal CLK1 of the high-level voltage HV, the second switching transistor T2 is turned on in response to the low-level voltage LV of the first node N1, and the first clock signal CLK1 of the high-level voltage HV is transmitted to the second node N2.

The high-level voltage HV of the second node N2 turns off the fifth switching transistor T5 and the sixth switching transistor T6. Furthermore, the seventh switching transistor T7 is turned off in response to the second clock signal CLK2 of the high-level voltage HV. The eighth switching transistor T8 is turned on in response to the low-level voltage LV of the first node N1, and the second voltage VGH is applied to the second output node NQB. The high-level voltage HV is applied to both electrodes of the third capacitor C3.

The first output transistor M1 is turned on in response to the low-level voltage LV of the first output node NQ, and as the first voltage VGL is applied to the stage output node NO, the emission control signal EM of the low-level voltage LV is output. The second output transistor M2 is turned off in response to the high-level voltage HV of the second output node NQB.

The floating transistor FT is turned off in response to the low-level voltage LV of the first node N1. As the floating transistor FT and the sixth and seventh switching transistors T6 and T7 connected to both electrodes of the first capacitor C1 are all turned off, the first capacitor C1 is in a floating state, and current is not charged in or discharged from the first capacitor C1. Accordingly, there is no power consumption to charge or discharge the first capacitor C1 in the fourth period P4.

In the fifth period P5, the input signal FLM/CARRY having the high-level voltage HV, the first clock signal CLK1 having the low-level voltage LV, and the second clock signal CLK2 having the high-level voltage HV are input to the stage 100. In the fifth period P5, the first circuit portion 110 generates the first control signal SC1 having the high-level voltage HV and the second control signal SC2 having the low-level voltage LV.

The first switching transistor T1 is turned on in response to the first clock signal CLK1 having the low-level voltage LV, and the input signal FLM/CARRY of the high-level voltage HV is transmitted to the first node N1. Accordingly, the voltage of the first node N1, that is, the first control signal SC1, has the high-level voltage HV. The first control signal SC1 having the high-level voltage HV is transmitted to the first output node NQ.

The second switching transistor T2 is turned off in response to the high-level voltage HV of the first node N1. The third switching transistor T3 is turned on in response to the first clock signal CLK1 having the low-level voltage LV, and the first voltage VGL is applied to the second node N2. The voltage of the second node N2, that is, the second control signal SC2, has the low-level voltage LV.

The fourth switching transistor T4 is turned off in response to the high-level voltage HV of the first output node NQ. The fifth switching transistor T5 is turned on in response to the low-level voltage LV of the second node N2, that is, the second control signal SC2, and the second voltage VGH is applied to the third node N3. As the high-level voltage HV is applied to both electrodes of the second capacitor C2 connected between the third node N3 and the first output node NQ, a substantially zero voltage is stored in the second capacitor C2.

The sixth switching transistor T6 is turned on in response to the low-level voltage LV of the second node N2, that is, the second control signal SC2, and the second clock signal CLK2 of the high-level voltage HV is transmitted to the fourth node N4. The floating transistor FT is turned on in response to the high-level voltage HV of the first node N1, and the low-level voltage LV of the second node N2 is transmitted to the fifth node N5. The first capacitor C1 may include the first electrode connected to the fourth node N4 and the second electrode connected to the fifth node N5, the high-level voltage HV of the second clock signal CLK2 is applied to the first electrode, and the low-level voltage LV of the second node N2 is applied to the second electrode, and thus the voltage difference between the high-level voltage HV and the low-level voltage LV, that is, the reference voltage difference, is stored in the first capacitor C1.

The seventh switching transistor T7 is turned off in response to the second clock signal CLK2 of the high-level voltage HV, and the eighth switching transistor T8 is turned off in response to the high-level voltage HV of the first node N1. The second voltage VGH is applied to the first electrode of the third capacitor C3, and a substantially zero voltage is stored in the third capacitor C3. The second output node NQB has the high-level voltage HV due to the third capacitor C3 that stores the substantially zero voltage.

The first output transistor M1 is turned off in response to the high-level voltage HV of the first output node NQ, and the second output transistor M2 is turned off in response to the high-level voltage HV of the second output node NQB. As the control line for outputting the emission control signal EM has parasitic capacitance, the emission control signal EM may maintain a voltage of the previous period P4, that is, the low-level voltage LV.

The floating transistor FT is turned on in response to the high-level voltage HV of the first node N1, and the low-level voltage LV of the second node N2 is transmitted to the fifth node N5. When the reference voltage difference is stored in the first capacitor C1 in the fourth period P4, there is no power consumption to charge or discharge the first capacitor C1 in the fifth period P5.

In the sixth period P6, the input signal FLM/CARRY having the high-level voltage HV, the first clock signal CLK1 having the high-level voltage HV, and the second clock signal CLK2 having the high-level voltage HV are input to the stage 100. In the sixth period P6, the first circuit portion 110 generates the first control signal SC1 having the high-level voltage HV and the second control signal SC2 having the low-level voltage LV.

The first switching transistor T1 is turned off in response to the first clock signal CLK1 having the high-level voltage HV. However, the sixth switching transistor T6 is turned on due to the reference voltage difference stored in the first capacitor C1. The second clock signal CLK2 having the high-level voltage HV is applied to the fourth node N4 through the sixth switching transistor T6 that is turned on. The fifth node N5 has the low-level voltage LV due to the first capacitor C1 that stores the reference voltage difference. As described below, as the floating transistor FT is turned on in the sixth period P6 and the fifth node N5 and the second node N2 are connected to each other, the second control signal SC2 of the second node N2 has the low-level voltage LV.

The fifth switching transistor T5 is turned on in response to the low-level voltage LV of the second node N2, and the second voltage VGH is applied to the third node N3. In the fifth period P5, as the substantially zero voltage is stored in the second capacitor C2, the first output node NQ and the first node N1 have the high-level voltage HV due to the second capacitor C2 that stores the substantially zero voltage.

The second switching transistor T2 is turned off in response to the high-level voltage HV of the first node N1, and the third switching transistor T3 is turned off in response to the high-level voltage HV of the first clock signal CLK1. As described above, the floating transistor FT is turned on in response to the high-level voltage HV of the first node N1.

The seventh switching transistor T7 is turned off in response to the high-level voltage HV of the second clock signal CLK2, and the eighth switching transistor T8 is turned off in response to the high-level voltage HV of the first node N1. The second voltage VGH is applied to the first electrode of the third capacitor C3, and a substantially zero voltage is stored in the third capacitor C3. The second output node NQB has the high-level voltage HV due to the third capacitor C3 that stores the substantially zero voltage.

The first output transistor M1 is turned off in response to the high-level voltage HV of the first output node NQ, and the second output transistor M2 is turned off in response to the high-level voltage HV of the second output node NQB. As the control line for outputting the emission control signal EM has parasitic capacitance, the emission control signal EM may maintain a voltage of the previous period P4, that is, the low-level voltage LV.

In the sixth period P6, as the first capacitor C1 maintains the reference voltage difference, there is no power consumption to charge or discharge the first capacitor C1.

In the seventh period P7, the input signal FLM/CARRY having the high-level voltage HV, the first clock signal CLK1 having the high-level voltage HV and the second clock signal CLK2 having the low-level voltage LV are input to the stage 100. In the seventh period P7, the first circuit portion 110 generates the first control signal SC1 having the high-level voltage HV and the second control signal SC2 having the second low-level voltage LV2.

The first switching transistor T1 is turned off in response to the first clock signal CLK1 having the high-level voltage HV. However, the sixth switching transistor T6 is turned on due to the reference voltage difference stored in the first capacitor C1. The low-level voltage LV of the second clock signal CLK2 is applied to the fourth node N4 through the sixth switching transistor T6 that is turned on. The fifth node N5 has the second low-level voltage LV2 due to the first capacitor C1 that stores the reference voltage difference. The second low-level voltage LV2 is a voltage lower than the low-level voltage LV by the reference voltage difference. As described below, in the seventh period P7, as the floating transistor FT is turned on and the fifth node N5 and the second node N2 are connected to each other, the second control signal SC2 of the second node N2 has the second low-level voltage LV2.

The fifth switching transistor T5 is turned on in response to the second low-level voltage LV2 of the second node N2, and the second voltage VGH is applied to the third node N3. In the sixth period P6, as the substantially zero voltage is stored in the second capacitor C2, the first output node NQ and the first node N1 have the high-level voltage HV due to the second capacitor C2 that stores the substantially zero voltage.

The second switching transistor T2 is turned off in response to the high-level voltage HV of the first node N1, and the third switching transistor T3 is turned off in response to the high-level voltage HV of the first clock signal CLK1. As described above, the floating transistor FT is turned on in response to the high-level voltage HV of the first node N1.

The seventh switching transistor T7 is turned on in response to the low-level voltage LV of the second clock signal CLK2, and connects the fourth node N4 and the second output node NQB to each other. The low-level voltage LV of the second clock signal CLK2 is applied not only to the fourth node N4, but also to the second output node NQB.

The eighth switching transistor T8 is turned off in response to the high-level voltage HV of the first node N1. As the second voltage VGH is applied to the first electrode of the third capacitor C3 and the low-level voltage LV is applied to the second electrode connected to the second output node NQB, the reference voltage difference is stored in the third capacitor C3.

As the second output transistor M2 is turned on in response to the low-level voltage LV of the second output node NQB and the second voltage VGH is applied to the stage output node NO, the emission control signal EM of the high-level voltage HV is output. The first output transistor M1 is turned off in response to the high-level voltage HV of the first output node NQ.

In the seventh period P7, as the first capacitor C1 maintains the reference voltage difference, there is no power consumption to charge or discharge the first capacitor C1.

In the eighth period P8, the input signal FLM/CARRY having the high-level voltage HV, the first clock signal CLK1 having the high-level voltage HV, and the second clock signal CLK2 having the high-level voltage HV are input to the stage 100. In the eighth period P8, the first circuit portion 110 generates the first control signal SC1 having the high-level voltage HV and the second control signal SC2 having the low-level voltage LV.

The first switching transistor T1 is turned off in response to the high-level voltage HV of the first clock signal CLK1. However, the sixth switching transistor T6 is turned on due to the reference voltage difference stored in the first capacitor C1. The high-level voltage HV of the second clock signal CLK2 is applied to the fourth node N4 through the sixth switching transistor T6 that is turned on. The fifth node N5 has the low-level voltage LV due to the first capacitor C1 that stores the reference voltage difference. As described below, in the eighth period P8, as the floating transistor FT is turned on and the fifth node N5 and the second node N2 are connected to each other, the second control signal SC2 of the second node N2 has the low-level voltage LV.

The fifth switching transistor T5 is turned on in response to the low-level voltage LV of the second node N2, and the second voltage VGH is applied to the third node N3. In the seventh period P7, as the substantially zero voltage is stored in the second capacitor C2, the first output node NQ and the first node N1 have the high-level voltage HV due to the second capacitor C2 that stores the substantially zero voltage.

The second switching transistor T2 is turned off in response to the high-level voltage HV of the first node N1, and the third switching transistor T3 is turned off in response to the high-level voltage HV of the first clock signal CLK1.

As described above, the floating transistor FT is turned on in response to the high-level voltage HV of the first node N1.

The seventh switching transistor T7 is turned off in response to the high-level voltage HV of the second clock signal CLK2. The eighth switching transistor T8 is turned off in response to the high-level voltage HV of the first node N1. As the reference voltage difference is stored in the third capacitor C3 and the second voltage VGH is applied to the first electrode of the third capacitor C3, the second output node NQB has the low-level voltage LV.

As the second output transistor M2 is turned on in response to the low-level voltage LV of the second output node NQB and the second voltage VGH is applied to the stage output node NO, the emission control signal EM of the high-level voltage HV is output. The first output transistor M1 is turned off in response to the high-level voltage HV of the first output node NQ.

In the eighth period P8, as the first capacitor C1 maintains the reference voltage difference, there is no power consumption to charge or discharge the first capacitor C1.

While the input signal FLM/CARRY has the high-level voltage HV, the operations of the fifth period P5 to the eighth period P8 are repeated, and the stage output node NO outputs the emission control signal EM of the high-level voltage HV. As the reference voltage difference is applied to both electrodes of the first capacitor C1 in the fifth period P5 and the first capacitor C1 maintains the reference voltage difference from the sixth period P6 to the eighth period P8, there is substantially no power consumption to charge or discharge the first capacitor C1 while the operations of the fifth period P5 to the eighth period P8 are repeated.

In the ninth period P9, the input signal FLM/CARRY is shifted to the low-level voltage LV. In the ninth period P9, the input signal FLM/CARRY having the low-level voltage LV, the first clock signal CLK1 having the high-level voltage HV, and the second clock signal CLK2 having the low-level voltage LV are input to the stage 100. In the ninth period P9, the first circuit portion 110 generates the first control signal SC1 having the high-level voltage HV and the second control signal SC2 having the second low-level voltage LV2.

Although the ninth period P9 is different from the seventh period P7 in that the input signal FLM/CARRY has the low-level voltage LV, as the first switching transistor T1 is turned off by the high-level voltage HV of the first clock signal CLK1, the low-level voltage LV of the input signal FLM/CARRY is not applied to the first node N1. Accordingly, the operation of the ninth period P9 is substantially the same as the operation of the seventh period P7.

The first switching transistor T1 is turned off in response to the first clock signal CLK1 having the high-level voltage HV. However, the sixth switching transistor T6 is turned on due to the reference voltage difference stored in the first capacitor C1. The low-level voltage LV of the second clock signal CLK2 is applied to the fourth node N4 through the sixth switching transistor T6. The fifth node N5 has the second low-level voltage LV2 due to the first capacitor C1 that stores the reference voltage difference. As the fifth node N5 and the second node N2 are connected to each other by the floating transistor FT that is turned on, the second control signal SC2 of the second node N2 has the second low-level voltage LV2.

The fifth switching transistor T5 is turned on in response to the second low-level voltage LV2 of the second node N2, and the second voltage VGH is applied to the third node N3. The first output node NQ and the first node N1 have the high-level voltage HV due to the second capacitor C2 that stores the substantially zero voltage.

The second switching transistor T2 is turned off in response to the high-level voltage HV of the first node N1, and the third switching transistor T3 is turned off in response to the high-level voltage HV of the first clock signal CLK1. The floating transistor FT is turned on in response to the high-level voltage HV of the first node N1.

The seventh switching transistor T7 is turned on in response to the low-level voltage LV of the second clock signal CLK2, and connects the fourth node N4 and the second output node NQB to each other. The low-level voltage LV of the second clock signal CLK2 is applied not only to the fourth node N4, but also to the second output node NQB.

The eighth switching transistor T8 is turned off in response to the high-level voltage HV of the first node N1. As the second voltage VGH is applied to the first electrode of the third capacitor C3 and the low-level voltage LV is applied to the second electrode connected to the second output node NQB, the reference voltage difference is stored in the third capacitor C3.

As the second output transistor M2 is turned on in response to the low-level voltage LV of the second output node NQB and the second voltage VGH is applied to the stage output node NO, the emission control signal EM of the high-level voltage HV is output. The first output transistor M1 is turned off in response to the high-level voltage HV of the first output node NQ.

In the ninth period P9, as the first capacitor C1 maintains the reference voltage difference, there is no power consumption to charge or discharge the first capacitor C1.

In the tenth period P10, the input signal FLM/CARRY having the low-level voltage LV, the first clock signal CLK1 having the high-level voltage HV, and the second clock signal CLK2 having the high-level voltage HV are input to the stage 100. In the tenth period P10, the first circuit portion 110 generates the first control signal SC1 having the high-level voltage HV and the second control signal SC2 having the low-level voltage LV.

Although the tenth period P10 is different from the eighth period P8 in that the input signal FLM/CARRY has the low-level voltage LV, as the first switching transistor T1 is turned off by the high-level voltage HV of the first clock signal CLK1, the low-level voltage LV of the input signal FLM/CARRY is not applied to the first node N1. Accordingly, the operation of the tenth period P10 is substantially the same as the operation of the eighth period P8.

The sixth switching transistor T6 is turned on due to the reference voltage difference stored in the first capacitor C1. The high-level voltage HV of the second clock signal CLK2 is applied to the fourth node N4 through the sixth switching transistor T6. The fifth node N5 has the low-level voltage LV due to the first capacitor C1 that stores the reference voltage difference. As the fifth node N5 and the second node N2 are connected to each other by the floating transistor FT that is turned on, the second control signal SC2 of the second node N2 has the low-level voltage LV.

The fifth switching transistor T5 is turned on in response to the low-level voltage LV of the second node N2, and the second voltage VGH is applied to the third node N3. The first output node NQ and the first node N1 have the high-level voltage HV due to the second capacitor C2 that stores the substantially zero voltage.

The second switching transistor T2 is turned off in response to the high-level voltage HV of the first node N1, and the third switching transistor T3 is turned off in response to the high-level voltage HV of the first clock signal CLK1.

The floating transistor FT is turned on in response to the high-level voltage HV of the first node N1.

The seventh switching transistor T7 is turned off in response to the high-level voltage HV of the second clock signal CLK2. The eighth switching transistor T8 is turned off in response to the high-level voltage HV of the first node N1. As the reference voltage difference is stored in the third capacitor C3 and the second voltage VGH is applied to the first electrode of the third capacitor C3, the second output node NQB has the low-level voltage LV.

As the second output transistor M2 is turned on in response to the low-level voltage LV of the second output node NQB and the second voltage VGH is applied to the stage output node NO, the emission control signal EM of the high-level voltage HV is output. The first output transistor M1 is turned off in response to the high-level voltage HV of the first output node NQ.

In the tenth period P10, as the first capacitor C1 maintains the reference voltage difference, there is no power consumption to charge or discharge the first capacitor C1.

In the eleventh period P11, the input signal FLM/CARRY having the low-level voltage LV, the first clock signal CLK1 having the low-level voltage LV, and the second clock signal CLK2 having the high-level voltage HV are input to the stage 100. In the eleventh period P11, the first circuit portion 110 generates the first control signal SC1 having the low-level voltage LV and the second control signal SC2 having the low-level voltage LV.

The signals input in the eleventh period P11 have the same voltage level as the signals input in the first period P1. The first switching transistor T1 is turned on due to the low-level voltage LV of the first clock signal CLK1, and the low-level voltage LV of the input signal FLM/CARRY is applied to the first node N1. Accordingly, the operation of the eleventh period P11 is substantially the same as the operation of the first period P1.

The first switching transistor T1 is turned on in response to the low-level voltage LV of the first clock signal CLK1, and the low-level voltage LV of the input signal FLM/CARRY is applied to the first node N1. The voltages of the first node N1 and the first output node NQ have the low-level voltage LV.

The second switching transistor T2 is turned on in response to the low-level voltage LV of the first node N1, and the low-level voltage LV of the first clock signal CLK1 is applied to the second node N2. The third switching transistor T3 is turned on in response to the low-level voltage LV of the first clock signal CLK1, and the first voltage VGL is applied to the second node N2. The voltage of the second node N2, that is, the second control signal SC2, has the low-level voltage LV.

The fifth switching transistor T5 is turned on in response to the low-level voltage LV of the second node N2, and the second voltage VGH is applied to the third node N3. The fourth switching transistor T4 is turned on in response to the low-level voltage LV of the first output node NQ, and the high-level voltage HV of the second clock signal CLK2 is transmitted to the third node N3. As the high-level voltage HV is applied to the first electrode of the second capacitor C2 and the low-level voltage LV is applied to the second electrode connected to the first output node NQ, the reference voltage difference is stored in the second capacitor C2.

The sixth switching transistor T6 is turned on in response to the low-level voltage LV of the second node N2, and the high-level voltage HV of the second clock signal CLK2 is applied to the fourth node N4. The seventh switching transistor T7 is turned off in response to the high-level voltage HV of the second clock signal CLK2. The eighth switching transistor T8 is turned on in response to the low-level voltage LV of the first node N1, and the second voltage VGH is applied to the second output node NQB. As the high-level voltage HV is applied to both electrodes of the third capacitor C3, the third capacitor C3 stores the substantially zero voltage.

As the first output transistor M1 may be weakly turned on in response to the low-level voltage LV of the first output node NQ and the first voltage VGL is applied to the stage output node NO, the emission control signal EM of the low-level voltage LV may be output. The second output transistor M2 is turned off in response to the high-level voltage HV of the second output node NQB.

The floating transistor FT is turned off in response to the low-level voltage LV of the first node N1, and the low-level voltage LV of the second node N2 is not transmitted to the fifth node N5. Accordingly, no current is charged in or discharged from the first capacitor C1, and thus there is no power consumption to charge or discharge the first capacitor C1 in the eleventh period P11.

In the twelfth period P12, the input signal FLM/CARRY having the low-level voltage LV, the first clock signal CLK1 having the high-level voltage HV, and the second clock signal CLK2 having the high-level voltage HV are input to the stage 100.

The signals input in the twelfth period P12 have the same voltage level as the signals input in the second period P2. Accordingly, the operation of the twelfth period P12 is substantially the same as the operation of the second period P2. Then, until the input signal FLM/CARRY having the high-level voltage HV is input to the stage 100, the operations of the third period P3, the fourth period P4, the first period P1, and the second period P2 are repeated.

According to the operation of the stage 100 described with reference to FIG. 3, the first capacitor C1 may maintain a substantially constant reference voltage difference. Accordingly, there is substantially no power consumption to charge or discharge the first capacitor C1.

Figure 4:
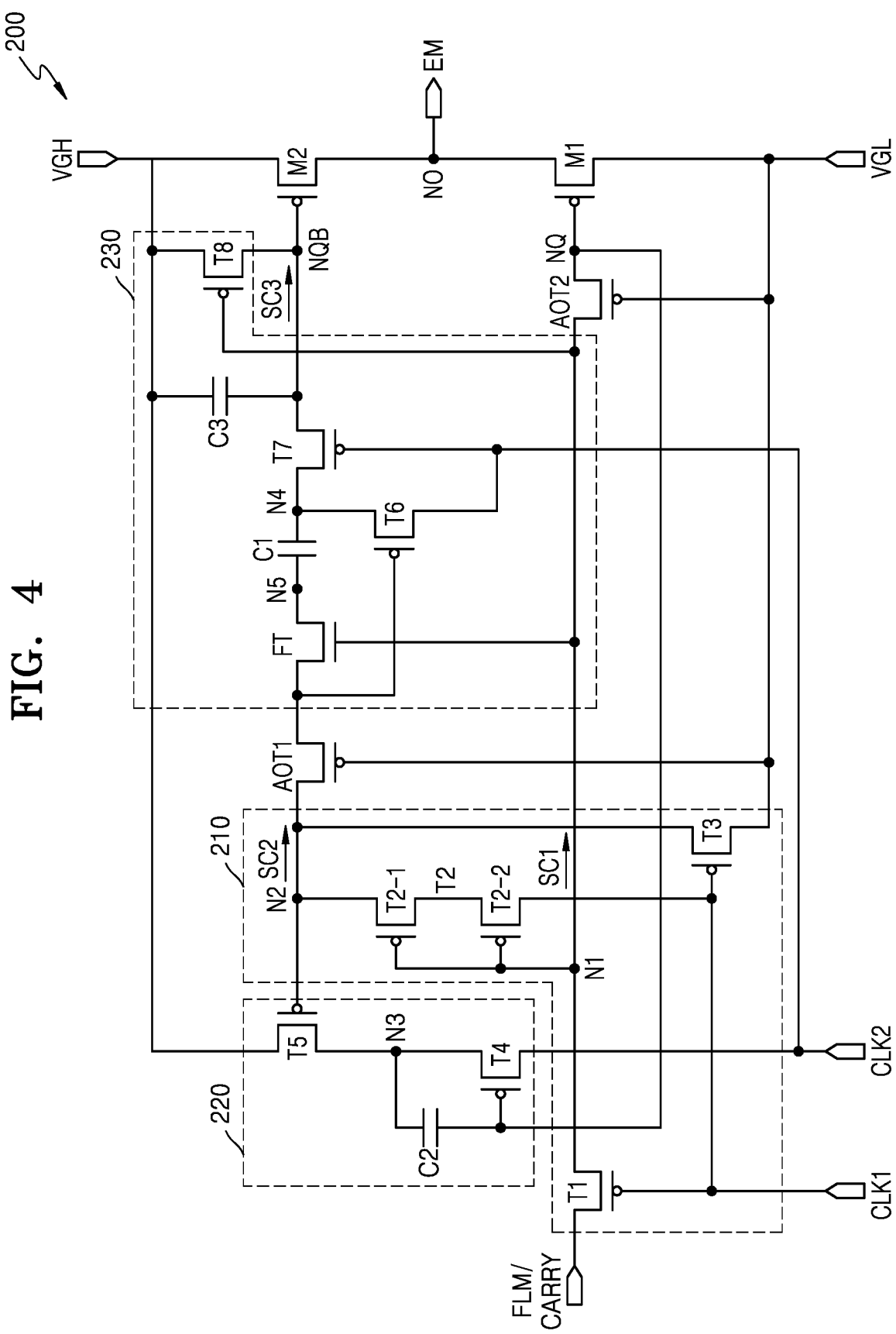
FIG. 4 is a circuit diagram of a stage included in an emission control driver, according to some example embodiments.

FIG. 4 is a circuit diagram of a stage 200 included in the emission control driver 1000, according to some example embodiments.

Referring to FIG. 4, the stage 200 may include a first circuit portion 210, a second circuit portion 220, a third circuit portion 230, the first output transistor M1, and the second output transistor M2. The stage 200 corresponds to one of the first to third stages 1100, 1200, and 1300 of FIG. 1.

The first circuit portion 210, the second circuit portion 220, the third circuit portion 230, the first output transistor M1, and the second output transistor M2 respectively and substantially correspond to the first circuit portion 110, the second circuit portion 120, the third circuit portion 130, the first output transistor M1, and the second output transistor M2 included in the stage 100 of FIG. 2.

The stage 200 may further include a first always-on transistor AOT1 through which the second control signal SC2 passes between the first circuit portion 210 and the third circuit portion 230. The first always-on transistor AOT1 may be always turned on by including a gate to which the first voltage VGL of a low level is applied, and may connect the second node N2 and the floating transistor FT to each other.

The first always-on transistor AOT1 may protect the fifth switching transistor T5 from a voltage applied to a gate of the fifth switching transistor T5. For example, as the second node N2 has the second low-level voltage LV2 in the seventh period P7 and the ninth period P9, the second low-level voltage LV2 is applied to the gate of the fifth switching transistor T5. In this case, the turn-on resistance of the first always-on transistor AOT1 may protect the fifth switching transistor T5.

The stage 200 may further include a second always-on transistor AOT2 through which the first control signal SC1 passes between the first circuit portion 210 and the first output node NQ. The second always-on transistor AOT2 may be always turned on by including a gate to which the first voltage VGL of a low level is applied, and may connect the first node N1 and the first output node NQ to each other.

The second always-on transistor AOT2 has turn-on resistance between the first node N1 and the first output node NQ. The second always-on transistor AOT2 may protect the first switching transistor T1 by preventing application of an excessively large voltage between a drain and a source of the first switching transistor T1.

Two switching transistors T2-1 and T2-1 of the stage 200 are connected in series to perform the same function as the second switching transistor T2 of the stage 100. The two switching transistors T2-1 and T2-1 may prevent leakage of the charge stored in the first capacitor C1. Accordingly, power consumption to supplement the charge leaking from the first capacitor C1 may be reduced.

Figure 5:
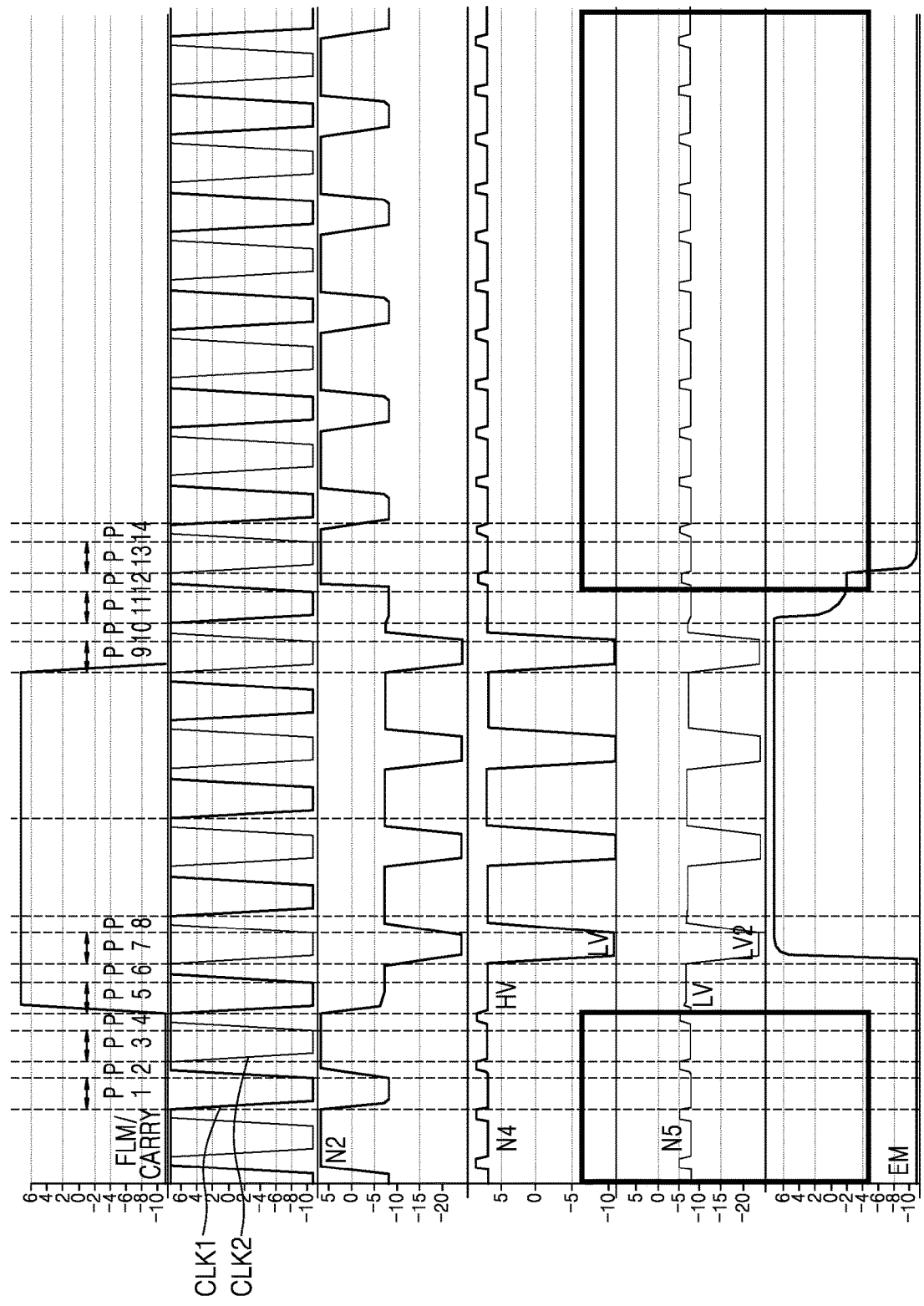
FIG. 5 is a voltage waveform diagram of major nodes of the circuit diagram of FIG. 4.

FIG. 5 is a voltage waveform diagram of major nodes of the circuit diagram of FIG. 4.

Referring to FIG. 5, the voltage waveform diagram of FIG. 5 is substantially the same as the timing diagram of FIG. 3.

As illustrated in FIG. 5, a voltage between the voltage of the fourth node N4 and the voltage of the fifth node N5 is always maintained substantially constant. In the second period P2, the fourth period P4, and the twelfth period P12, in which the first capacitor C1 is in a floating state, although the electric potential of the fourth node N4 and the fifth node N5 is substantially increased by the same amount due to the effect of parasitic capacitance, it is not that the first capacitor C1 is charged or discharged during the period. Accordingly, it may be seen that there is substantially no power consumption to charge or discharge the first capacitor C1.

Figure 6:
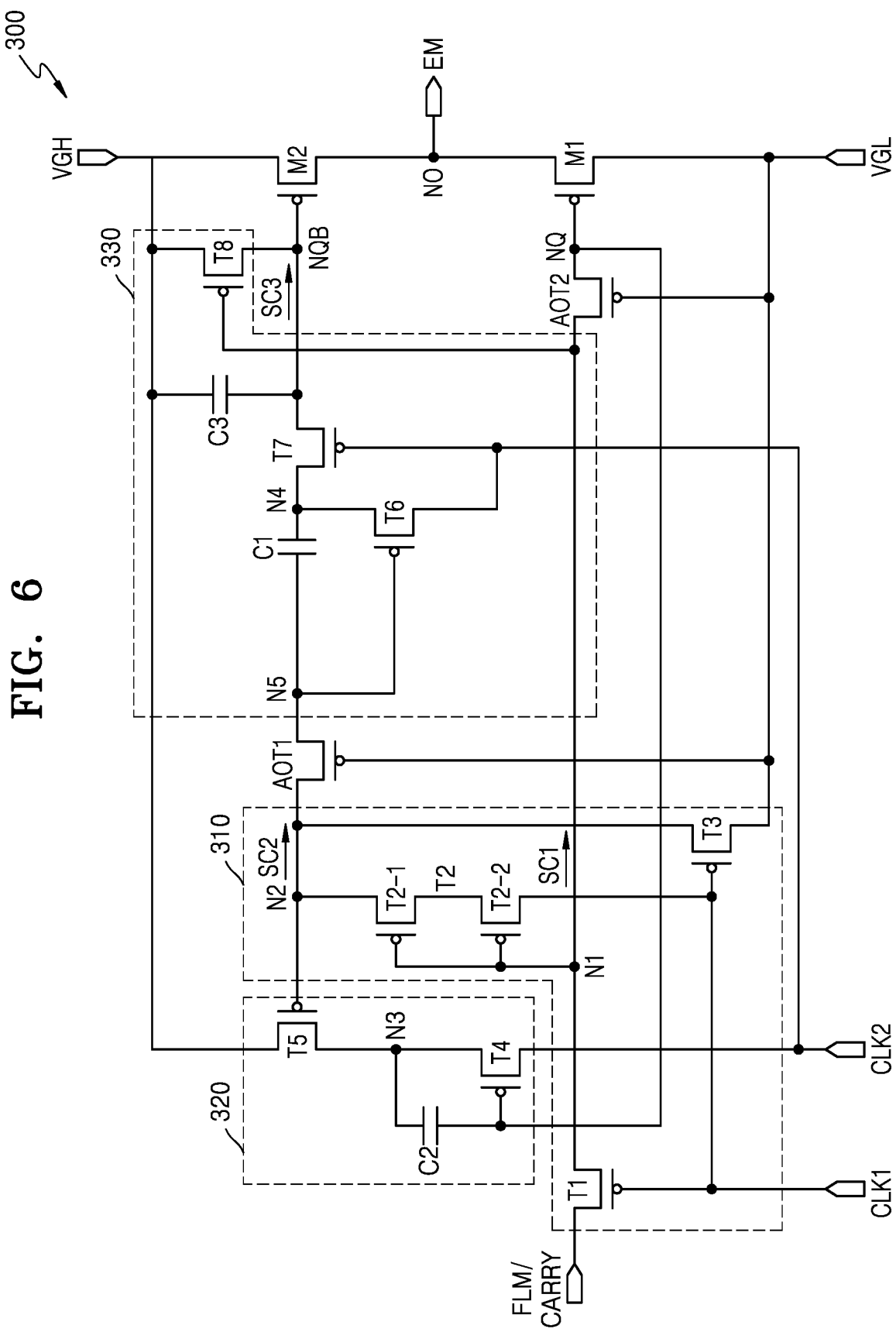
FIG. 6 is a circuit diagram of a stage included in an emission control driver, according to a comparative example.

FIG. 6 is a circuit diagram of a stage 300 included in the emission control driver 1000, according to a comparative example.

Referring to FIGS. 4 and 6, according to a comparative example, the stage 300 may include a first circuit portion 310, a second circuit portion 320, a third circuit portion 330, the first output transistor M1, and the second output transistor M2. The stage 300 is the same as the stage 200 except that the former does not include the floating transistor FT of the stage 200.

Figure 7:
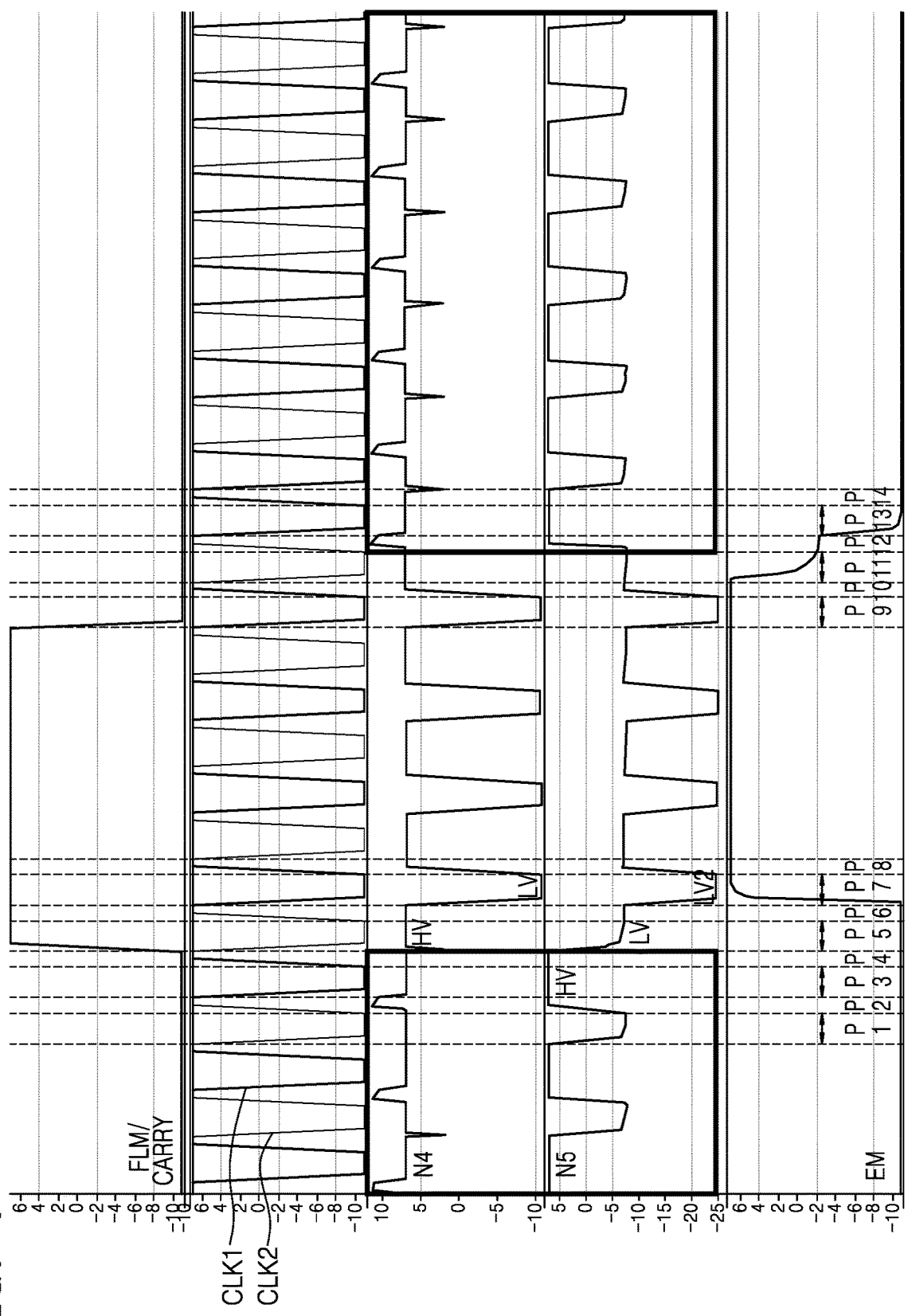
FIG. 7 is a voltage waveform of major nodes of the circuit diagram of FIG. 6.

FIG. 7 is a voltage waveform of major nodes of the circuit diagram of FIG. 6.

Referring to FIG. 7, although the voltage waveform of the fourth node N4 and the voltage waveform of the fifth node N5 correspond to each other in a period in which the input signal FLM/CARRY has the high-level voltage HV, as illustrated in a rectangular box B, the voltage waveform of the fourth node N4 and the voltage waveform of the fifth node N5 are different from each other in a period in which the input signal FLM/CARRY has the low-level voltage LV.

For example, as in the first period P1, the high-level voltage HV is applied to the fourth node N4 and the low-level voltage LV is applied to the fifth node N5, the first capacitor C1 stores the reference voltage difference. In the third period P3, as the high-level voltage HV is applied to both of the fourth node N4 and the fifth node N5, the first capacitor C1 stores the substantially zero voltage. Accordingly, in the period in which the input signal FLM/CARRY of the low-level voltage LV is input, the stage 300 repeats the operations corresponding to the first to fourth periods P1-P4, the first capacitor C1 is discharged from the reference voltage difference to the substantially zero voltage between the first period P1 and the third period P3, and the first capacitor C1 is charged from the substantially zero voltage to the reference voltage difference between the third period P3 and the first period P1. As such, as the first capacitor C1 unnecessarily repeats charge and discharge, unnecessary power consumption is generated.

Referring back to FIG. 5, as illustrated in a rectangular box A, in a period in which the input signal FLM/CARRY has the low-level voltage LV as a difference between the voltage of the fourth node N4 and the voltage of the fifth node N5 is constant, the first capacitor C1 does not unnecessarily repeat charge and discharge, and thus unnecessary power consumption may be prevented.

Figure 9:
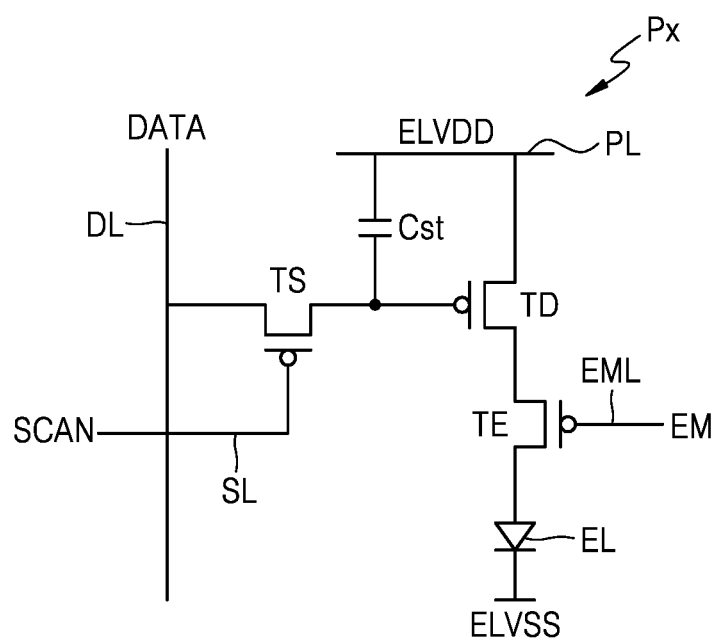
FIG. 9 is a circuit diagram of an example of a pixel included in the display apparatus of FIG. 8.

FIG. 8 is a block diagram of a display apparatus 500 according to an embodiment. FIG. 9 is a circuit diagram of an example of a pixel circuit of a pixel included in the display apparatus 500 of FIG. 8, although embodiments according to the present disclosure are not limited thereto, and the pixel circuit may include additional or fewer electrical components without departing from the spirit and scope of embodiments according to the present disclosure Referring to FIG. 8, the display apparatus 500 may include a display panel 510, a scan driver 520, a data driver 530, an emission control driver 540, and a timing controller 550.

The display panel 510 may include a plurality of pixels. A plurality of data lines DL and a plurality of scan lines SL may be arranged in the display panel 510, and a plurality of pixels may be arranged in areas where the data lines DL and the scan lines SL intersect with each other.

Referring to FIG. 9, a pixel (or pixel circuit) Px may include a driving transistor TD, a switching transistor TS, a storage capacitor Cst, an emission transistor TE, and an organic light-emitting diode EL. The switching transistor TS may be turned on or off in response to a scan signal SCAN supplied via the scan lines SL. When the switching transistor TS is turned on in response to the scan signal SCAN, a data signal DATA supplied via the data lines DL may be stored in the storage capacitor Cst. The driving transistor TD may generate a driving current based on the data signal DATA. The emission transistor TE may be turned on or off in response to the emission control signal EM supplied via the emission control line EML. When the emission transistor TE is turned on in response to the emission control signal EM, a driving current may be supplied to the organic light-emitting diode EL.

As illustrated in FIG. 9, the driving transistor TD, the switching transistor TS, and the emission transistor TE may be implemented by p-type MOSFETs. In this case, the driving transistor TD, the switching transistor TS, and the emission transistor TE may be turned on in response to a signal having a low-level voltage, for example, VGL. Although FIG. 9 illustrates the driving transistor TD, the switching transistor TS, and the emission transistor TE implemented by p-type MOSFETs, the driving transistor TD, the switching transistor TS, and the emission transistor TE are not limited thereto.

The scan driver 520 may supply the scan signal SCAN to the pixels via the scan lines SL. The data driver 530 may supply the data signal DATA to the pixels via the data lines DL in synchronism with the scan signal SCAN. The timing controller 550 may generate control signals to control the scan driver 520, the data driver 530, and the emission control driver 540.

The emission control driver 540 may supply the emission control signal EM to the pixels via the emission control line EMLs. The emission control driver 540 may include a plurality of stages. The respective stages connected to one another in cascade may sequentially output the emission control signals EMs. Each stage may receive a start signal or carry signal, a first clock signal, and a second clock signal. Each stage may include a first circuit portion, a second circuit portion, and a third circuit portion.

The first circuit portion may generate a first control signal at a first node and a second control signal at a second node, based on an input signal, such as the start signal or carry signal, and the first clock signal. The second circuit portion may control a voltage level of the first control signal based on the first control signal and the second clock signal. The third circuit portion may generate a third control signal based on the first control signal, the second control signal, and the second clock signal. The first output transistor may output a first voltage as the emission control signal in response to the first control signal, and the second output transistor may output a second voltage as the emission control signal in response to the third control signal.

The third circuit portion may include a first capacitor configured to maintain a substantially constant voltage between both electrodes while each stage outputs the emission control signal. As the substantially constant voltage is maintained between both electrodes of the first capacitor, the first capacitor is not charged or discharged, and thus there may be substantially no power consumption to charge or discharge the first capacitor.

Figure 10:
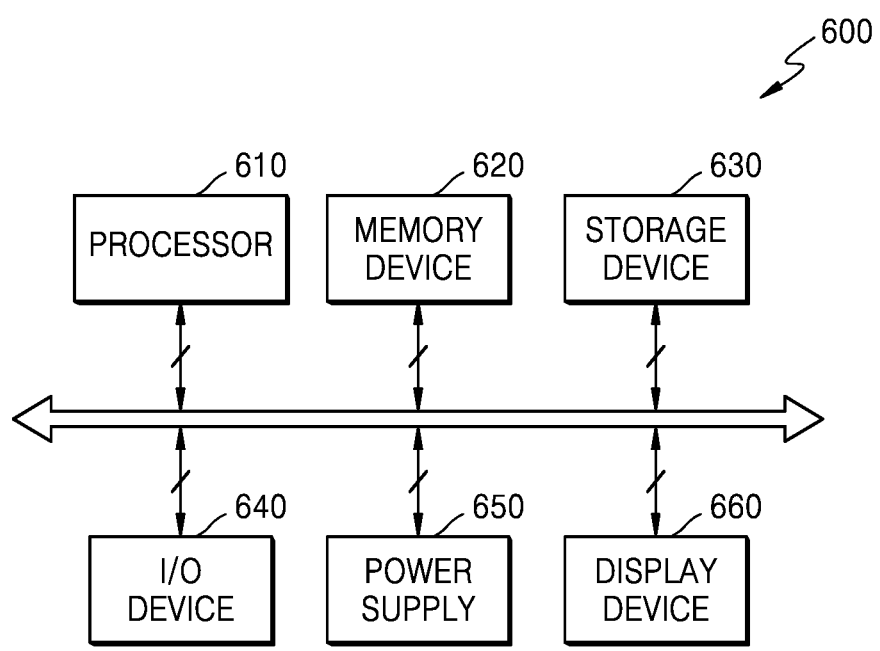
FIG. 10 is a block diagram of an electronic device including the display apparatus of FIG. 8.
Figure 11:
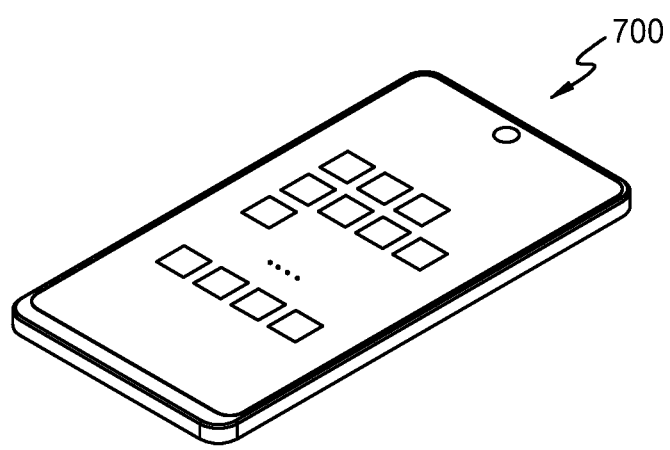
FIG. 11 illustrates an example of the electronic device of FIG. 10 being implemented as a smartphone.

FIG. 10 is a block diagram of an electronic device 600 including the display apparatus 500 of FIG. 8. FIG. 11 illustrates an example of the electronic device 600 of FIG. 10 being implemented as a smartphone.

Referring to FIGS. 10 and 11, the electronic device 600 may include a processor 610, a memory device 620, a storage device 630, an input/output device 640, a power supply 650, and a display apparatus 660. In this state, the display apparatus 660 may correspond to the display apparatus 500 of FIG. 8. Furthermore, the electronic device 600 may further include several ports that may communicate with a video card, a sound card, a memory card, a USB device, or other systems. As illustrated in FIG. 11, the electronic device 600 may be implemented by a smartphone 700, but the electronic device 600 is not limited thereto.

The processor 610 may perform specific calculations or tasks. According to some example embodiments, the processor 610 may be a microprocessor or a central processing unit (CPU). The processor 610 may be connected to other constituent elements via an address bus, a control bus, and a data bus. Furthermore, the processor 610 may be connected to an extension bus such as a peripheral component interconnect (PCI) bus. The memory device 620 may store data needed for the operation of the electronic device 600. For example, the memory device 620 may include a non-volatile memory device such as electrically programmable read only memory (EPROM), electrically erasable programmable read only memory (EEPROM), a flash memory, phase change random access memory (PRAM), resistance random access memory (RRAM), magnetic random access memory (MRAM), ferroelectric random access memory (FRAM), etc., and/or a volatile memory device such as dynamic random access memory (DRAM), static random access memory (SRAM), mobile DRAM, etc. The storage device 630 may include a solid state drive (SSD), a hard disc drive (HDD), a CD-ROM, etc.

The input/output device 640 may include an input device such as a keyboard, a keypad, a touch pad, a touch screen, a mouse, etc. and an output device such as a speaker, a printer, etc. The display apparatus 660 may be provided in the input/output device 640. The power supply 650 may supply power needed for the operation of the electronic device 600. The display apparatus 660 may be connected to other constituent elements via the buses or other communication links. As described above, the display apparatus 660 may include a display panel, a scan driver, a data driver, an emission control driver, and a timing controller. The display panel may include a plurality of pixels. The scan driver may supply scan signals to pixels. The data driver may supply data signals to the pixels in response to the scan signals. The emission control driver may supply emission control signals to the pixels. The emission control driver may include a plurality of stages. Each stage may include a first circuit portion, a second circuit portion, and a third circuit portion. The first circuit portion may generate a first control signal and a second control signal based on a start signal or a carry signal, and a first clock signal. The second circuit portion may control the voltage level of the first control signal based on the second control signal and a second clock signal. The third circuit portion may generate a third control signal based on the second control signal and the second clock signal. The first output transistor and the second output transistor may output emission control signals in response to the first control signal and the third control signal. In this state, the voltage level of the first control signal may be controlled by using a coupling effect while the first output transistor is turned off, and the voltage level of the first control signal may be maintained while the first output transistor is turned on. Accordingly, the first output transistor may be stably driven.

As described above, the electronic device 600 may include the display apparatus 660 including the emission control driver. In this state, as each stage of the emission control driver includes the first circuit portion, the second circuit portion, and the third circuit portion, and the third circuit portion includes a first capacitor configured to maintain a substantially constant voltage between both electrodes while the emission control signal is output, there may be no power consumption to charge or discharge the first capacitor.

According to various embodiments, as the transistor that is connected in series to the capacitor included in each stage of the emission control driver is turned off in a period in which the capacitor is unnecessarily charged and discharged, unnecessary power consumption may be prevented. Power consumption of the emission control driver according to some embodiments and the display apparatus and electronic device including the emission control driver may be reduced.

In the present specification, although the disclosure is described mainly regarding the limited embodiments, various embodiments are possible within the scope of the disclosure. Also, according to some example embodiments, equivalent means may be combined to the disclosure as it is. Accordingly, the true protection scope of the disclosure should be defined by the claims below.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. An emission control driver comprising:
  a plurality of stages connected to each other in cascade and configured to sequentially output respective emission control signals,
  wherein each of the plurality of stages comprises:
  a first circuit portion configured to generate a first control signal at a first node and a second control signal at a second node based on an input signal and a first clock signal;
  a second circuit portion configured to control a voltage level of the first control signal based on the first control signal and a second clock signal;
  a third circuit portion configured to generate a third control signal based on the first control signal, the second control signal, and the second clock signal;
  a first output transistor configured to output a first voltage as the emission control signal in response to the first control signal; and
  a second output transistor configured to output a second voltage as the emission control signal in response to the third control signal, and
  wherein the third circuit portion comprises a first capacitor configured to maintain a substantially constant voltage between both electrodes while each of the plurality of stages outputs the emission control signal, and
  wherein the third circuit portion further comprises a floating transistor connected between the second node and the first capacitor.

2. The emission control driver of claim 1, wherein the floating transistor is configured to be turned off in response to the input signal having a low-level voltage and the first voltage is output as the emission control signal, to separate the second node and the first capacitor from each other, and
  the floating transistor is configured to be turned on in response to the input signal having a high-level voltage or the second voltage is output as the emission control signal, to connect the second node and the first capacitor to each other.

3. The emission control driver of claim 1, wherein the floating transistor is configured to connect or separate the second node and the first capacitor to or from each other in response to the first control signal, and
  a conductive type of the floating transistor is opposite to a conductive type of the second output transistor.

4. The emission control driver of claim 1, wherein the first circuit portion comprises:
  a first switching transistor configured to transmit the input signal to the first node in response to the first clock signal;
  a second switching transistor configured to transmit the first clock signal to the second node in response to the first control signal; and
  a third switching transistor configured to apply the first voltage to the second node in response to the first clock signal.

5. The emission control driver of claim 1, wherein the second circuit portion comprises:

a fourth switching transistor configured to transmit the second clock signal to a third node in response to the first control signal;

a fifth switching transistor configured to apply the second voltage to the third node in response to the second control signal; and a second capacitor connected between a gate of the fourth switching transistor and the third node.

6. The emission control driver of claim 1, wherein the third circuit portion comprises:

a sixth switching transistor configured to transmit the second clock signal to a fourth node in response to the second control signal;

the first capacitor connected between the fourth node and a fifth node;

a floating transistor configured to connect the second node and the fifth node to each other in response to the first control signal;

a seventh switching transistor configured to connect the fourth node and a gate of the second output transistor to each other in response to the second clock signal;

an eighth switching transistor configured to apply the second voltage to a gate of the second output transistor in response to the first control signal; and a third capacitor including a first electrode configured to receive the second voltage and a second electrode at the gate of the second output transistor.

7. The emission control driver of claim 1, further comprising a first always-on transistor through which the second control signal passes between the first circuit portion and the third circuit portion.

8. The emission control driver of claim 1, further comprising a second always-on transistor through which the first control signal passes between the first circuit portion and the first output transistor.

9. The emission control driver of claim 1, wherein the first clock signal and the second clock signal have a same cycle and alternately have a low-level voltage.

10. The emission control driver of claim 1, wherein the first capacitor comprises a first electrode and a second electrode, and after each of the plurality of stages outputs the second voltage as the emission control signal, an electric potential of the first electrode is maintained higher than an electric potential of the second electrode by a difference between a high-level voltage corresponding to the second voltage and a low-level voltage corresponding to the first voltage.

11. The emission control driver of claim 10, wherein the first electrode and the second electrode are in a floating state in response to the input signal having a low-level voltage, both of the first and second clock signals have a high-level voltage, and the first voltage is output as the emission control signal.

12. The emission control driver of claim 11, wherein the third circuit portion further comprises a floating transistor configured to connect or separate the second node and the second electrode of the first capacitor to or from each other in response to the first control signal.

13. A display apparatus comprising:

a display panel comprising a plurality of pixels;

a scan driver configured to supply a scan signal to the plurality of pixels;

a data driver configured to supply a data signal to the plurality of pixels;

an emission control driver configured to supply an emission control signal to the plurality of pixels; and a timing controller configured to generate control signals to control the scan driver, the data driver, and the emission control driver, wherein the emission control driver comprises a plurality of stages connected to each other in cascade and configured to sequentially output emission control signals, wherein each of the plurality of stages comprises:

a first circuit portion configured to generate a first control signal at a first node and a second control signal at a second node based on an input signal and a first clock signal;

a second circuit portion configured to control a voltage level of the first control signal based on the first control signal and a second clock signal;

a third circuit portion configured to generate a third control signal based on the first control signal, the second control signal, and the second clock signal;

a first output transistor configured to output a first voltage as the emission control signal in response to the first control signal; and a second output transistor configured to output a second voltage as the emission control signal in response to the third control signal, and wherein the third circuit portion comprises a first capacitor configured to maintain a substantially constant voltage between both electrodes while each of the plurality of stages outputs the emission control signal, wherein the third circuit portion further comprises a floating transistor configured to connect or separate the second node and the first capacitor to or from each other in response to the first control signal.

14. The display apparatus of claim 13, wherein the floating transistor is configured to be turned off in response to the input signal having a low-level voltage and the first voltage is output as the emission control signal, to separate the second node and the first capacitor from each other, and is configured to be turned on in response to the input signal having a high-level voltage or the second voltage is output as the emission control signal, to connect the second node and the first capacitor to each other.

15. The display apparatus of claim 13, wherein the first circuit portion comprises:

a first switching transistor configured to transmit the input signal to the first node in response to the first clock signal;

a second switching transistor configured to transmit the first clock signal to the second node in response to the first control signal; and a third switching transistor configured to apply the first voltage to the second node in response to the first clock signal.

16. The display apparatus of claim 13, wherein the second circuit portion comprises:

a fourth switching transistor configured to transmit the second clock signal to a third node in response to the first control signal;

a fifth switching transistor configured to apply the second voltage to the third node in response to the second control signal; and a second capacitor connected between a gate of the fourth switching transistor and the third node.

17. The display apparatus of claim 13, wherein the third circuit portion comprises:

a sixth switching transistor configured to transmit the second clock signal to a fourth node in response to the second control signal;

the first capacitor connected between the fourth node and a fifth node;
a floating transistor configured to connect or separate the second node and the fifth node to or from each other in response to the first control signal;
a seventh switching transistor configured to connect or separate the fourth node and a gate of the second output transistor to or from each other in response to the second clock signal;
an eighth switching transistor configured to apply the second voltage to a gate of the second output transistor in response to the first control signal; and
a third capacitor including a first electrode to which the second voltage is applied and a second electrode at the gate of the second output transistor.

18. The display apparatus of claim 13, further comprising:
a first always-on transistor through which the second control signal passes between the first circuit portion and the third circuit portion; and
a second always-on transistor through which the first control signal passes between the first circuit portion and the first output transistor.

\* \* \* \* \*